(12) United States Patent
Murayama et al.

(10) Patent No.: US 6,341,006 B1
(45) Date of Patent: Jan. 22, 2002

(54) PROJECTION EXPOSURE APPARATUS

(75) Inventors: Masayuki Murayama, Kanagawa-ken; Haruo Ozawa, Tokyo, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/422,862

(22) Filed: Oct. 25, 1999

Related U.S. Application Data

(63) Continuation of application No. 09/207,270, filed on Dec. 8, 1998, which is a continuation-in-part of application No. 08/972,434, filed on Nov. 18, 1997, which is a continuation of application No. 08/628,452, filed on Apr. 5, 1996, now abandoned.

(30) Foreign Application Priority Data

| Apr. 7, 1995 | (JP) | 7-108177 |
| Apr. 7, 1995 | (JP) | 7-108178 |
| Dec. 8, 1997 | (JP) | 9-337105 |

(51) Int. Cl.$^7$ .................................. G03B 27/42
(52) U.S. Cl. ............... 355/53; 355/67; 250/492.1; 438/946; 438/625
(58) Field of Search .................. 355/43, 45, 53, 355/77, 67; 437/189; 250/492.1; 118/722; 356/399–401; 438/946, 625

(56) References Cited

U.S. PATENT DOCUMENTS

| 4,650,983 A | 3/1987 | Suwa | 250/204 |
| 4,699,515 A | 10/1987 | Tanimoto et al. | 356/401 |
| 4,895,107 A | 1/1990 | Yano et al. | 118/722 |
| 4,901,668 A | 2/1990 | Murakami | 118/722 |
| 5,026,664 A | * 6/1991 | Hongo et al. | |
| 5,559,584 A | 9/1996 | Miyaji et al. | 355/53 |

FOREIGN PATENT DOCUMENTS

| JP | 60-168112 | 8/1985 |
| JP | 60-186845 | 9/1985 |
| JP | 6-216000 | 8/1994 |
| JP | 6-260385 | 9/1994 |
| JP | 9-186077 | 7/1997 |
| JP | 9-306825 | 11/1997 |

OTHER PUBLICATIONS

U.S. Patent Application Serial No. 206,168, filed on Mar. 7, 1994.

* cited by examiner

*Primary Examiner*—D. Rutledge
(74) *Attorney, Agent, or Firm*—Armstrong, Westerman, Hattori, Mcleland & Naughton, LLP

(57) ABSTRACT

A projection exposure apparatus for projecting a pattern image of an illuminated mask onto a substrate. The optical path can be divided into a plurality of hermetic blocks each having an inert gas sealed therein by a plurality of partition devices. According a one aspect of the invention, a hermetic sealing member is disposed in the space between the substrate-side of the projection optical system and the substrate for replacing the atmosphere existing in the optical path of the illuminating light in that space by a substance other than oxygen. According to another aspect of the invention, a plurality of independent chambers are formed in a frame. Lids, piping, and valves in the chambers are opened or closed in response to the value detected by oxygen density sensors.

43 Claims, 16 Drawing Sheets

PROJECTION EXPOSURE APPARATUS

This application is a Rule 1.53(b) continuation of pending prior application Ser. No. 09/207,270 filed Dec. 8, 1998, which is a continuation-in-part of application Ser. No. 08/972,434 filed Nov. 18, 1997; which is a continuation of application Ser. No. 08/628,452 filed Apr. 5, 1996, now abandoned.

BACKGROUND OF THE INVENTION

The present invention relates to a projection exposure apparatus and, more particularly, to a projection exposure apparatus that uses far ultraviolet light for pattern formation in the process of producing semiconductor devices (IC, CCD, etc.), liquid crystal display devices, thin-film magnetic heads, and so forth.

The demand for larger-scale integration of semiconductor devices has been increasing year by year, and the pattern rule (i.e., a line width of a pattern) of the required circuit patterns has been correspondingly decreasing. It is known that the line width that can be resolved by a projection optical system reduces in proportion to the wavelength. Therefore, in order to form a circuit pattern of smaller pattern rule by photolithography process, it is only necessary to shorten the wavelength of light used for exposure. At the present, an exposure apparatus in which a KrF excimer laser having a wavelength of 248 nm is used as a light source has already been developed. Further, a mercury lamp having a wavelength of about 220 nm or 184 nm, an ArF excimer laser having a wave length of 193 nm and the like have been noted as a short wavelength light source.

In conventional exposure apparatuses in which g-ray (having a wavelength of 436 nm), i-ray (having a wavelength of 365 nm), a KrF excimer laser or a mercury lamp emitting light having a wave length of about 250 nm is used as a light source, since the wavelengths of these light beams are not overlapped with an absorption spectrum zone of oxygen, there is no inconvenience such as reduction in light available rate caused when light is absorbed by oxygen molecules in a light path and/or generation of ozone due to light absorption of the oxygen molecules.

However, in the light source such as the ArF excimer laser, since light emitting spectrum is overlapped with the absorption spectrum zone of oxygen, the above-mentioned reduction in light available rate and/or generation of ozone due to light absorption of the oxygen molecules will occur. For example, if it is assumed that transmittance of the ArF excimer laser beam in the vacuum or in inert gas such as nitrogen or helium is 100%/m, in a free-run condition (natural light emitting condition). i.e., in an ArF wide range laser, the transmittance becomes about 90%/m, and, even when an ArF narrow band laser is used for reducing a spectrum width to avoid absorbing lines of oxygen, the transmittance is decreased to about 98%/m.

It is considered that the reduction in transmittance is caused by influences of absorption of light caused by the oxygen molecules as well as generation of ozone. The generation of ozone not only affects a bad influence upon the transmittance (light available rate) but also worsens performance of the apparatus due to reaction to a surface of optical material or other components of parts.

In such exposure apparatuses, in order to prevent the reduction in transmittance and/or generation of ozone by reducing oxygen density in the light path, it is well known that a space including the entire light path must be filled with inert gas such as nitrogen (for example, refer to Japanese Patent Laid-open No. 6-260385 corresponding to U.S. Ser. No. 206,618 filed on Mar. 7, 1994).

FIG. 15 schematically shows a construction of an exposure apparatus (optical systems associated with illumination and image focusing are mainly illustrated and other parts are omitted from illustration). A light beam from an ArF excimer laser light source 201 is changed to a predetermined form by a beam shaping lens 202 and then is reflected by a mirror 203 to be incident on a beam expander lens 204. The light flux incident to the beam expander lens 204 is expanded or enlarged to a predetermined magnitude and then is reflected by a mirror 205 to be directed to a fly-eye lens 206 as an optical integrator, where illuminance is made uniform and an illuminating range is determined. Light from the fly-eye lens 206 is focused on a reticle conjugate surface by a first relay lens 207. The reticle conjugate surface is provided with a reticle blind 208 for regulating or limiting an exposure range. Light passed through the reticle blind 208 is illuminated onto a reticle 212 through a second relay lens 209, a mirror 210 and a main condenser lens 211. Light having passed through the reticle 212 is illuminated onto a wafer 214 through a projection lens 213, thereby focusing an image of the reticle 212 on the wafer 214.

FIG. 16 is a sectional view of an illumination optical system of the exposure apparatus, showing a light path from the ArF excimer laser light source 201 to the main condenser lens 211. A frame 221 contains optical parts such as the beam shaping lens 202 constituting the illumination optical system and is attached to the ArF excimer laser light source 201 via a bellows 223. Nitrogen gas from a nitrogen gas supply source 224 is supplied from one side of the frame 221 (i.e., a side to which the laser light source 201 is attached in FIG. 16) through a piping L201a and is discharged to a discharge device 225 from the other side of the frame 221.

In FIG. 16, while various optical parts were shown with simplification, actually, as shown in FIG. 17 (fully described later), each of the optical parts is constituted by a plurality of lenses which are integrally secured to the frame 221 by a support blocks 237. In FIG. 16, the reflection mirror 210 and the main condenser lens 211 are secured to the frame 221 by using a same support block 237h, and the other optical parts are secured to respective support blocks 237a–237g.

Each of the optical parts secured to the frame 221 forms respective optical block at each of the support blocks 237a–237h, and maintenance (such as replacement) is effected for independent block. Lids 222a, 222b, 222c serves to close openings (through which the optical blocks are inserted and removed when the optical blocks are mounted and dismounted with respect to the frame 221) formed in the frame 221, so that the interior of the frame 221 is sealed by the lids 222a, 222b, 222c. Incidentally, although not shown, O-rings or packings are disposed between the frame 221 and the lids 222a, 222b, 222c to improve sealing ability.

FIG. 17 shows an example of the optical parts. Lenses 232a, 232b, 232c are successively inserted into a lens barrel 231 and are secured by a hold-down ring 234. Incidentally, there are provided separation rings 233a, 233b for maintaining predetermined distances between the lenses. Vent holes 235a, 235b, 236a, 236b formed in the lens barrel 231 and the separation rings 233a, 233b serve to introduce inert gas between the lenses. When the nitrogen gas is supplied into the frame 221, the nitrogen gas also flows into the lens barrel 231 through the vent holes 235a, 235b, 236a, 236b to replace the air between the lenses by the nitrogen gas. The lens barrel 231 is secured to the support block by set screws 238.

However, in the illumination optical system of the exposure apparatus shown in FIG. 16, even when maintenance regarding at least one of the parts disposed in the frame 221 is effected, the entire interior of the frame 221 is exposed to atmosphere. Thus, a large amount of nitrogen gas contained within the frame 221 escapes or leaks outside, with the result that it takes a long time to re-fill the nitrogen gas in the frame 221 after the maintenance. Further, it is very difficult to judge whether the frame 221 is filled with the nitrogen gas sufficient to not affect an influence upon the exposure.

To solve the problem, it is conceivable to increase the number of hermetic blocks to thereby reduce the volumetric capacity of each block. However, merely increasing the number of blocks causes an increase in the number of transparent windows defining the boundary between each pair of adjacent blocks. Further, each transparent window also has a predetermined transmittance. Therefore, as the number of windows increases, exposure light is increasingly attenuated by the windows, resulting in an increase in the loss of light intensity.

Further, in the conventional apparatus disclosed in the above-mentioned JP(A) 6-260385, no particular hermetically sealing device is provided for the space between the projection optical system and a substrate as a workpiece, but an inert gas is blown into the optical path of exposure light in the space, thereby carrying out gas replacement for the space.

A conventional projection exposure apparatus of the type described above is usually provided with a focus detecting system in which measuring light is incident obliquely on a substrate, and the reflected light from the substrate is received to measure the heightwise position of the substrate (disclosed in detail in JP(A) 60-168112; corresponding to U.S. Pat. No. 4,650,983). The conventional projection exposure apparatus is further provided with an alignment system in which alignment light is applied to a mark on the substrate, and diffracted or scattered light from the mark is received to measure the position of the substrate, and a laser interferometer in which laser light is applied to a moving mirror provided on a substrate stage, and the reflected light from the moving mirror is received to measure the position of the substrate stage (the alignment system and the laser interferometer are disclosed in detail in JP(A) 60-186845).

However, in such a conventional projection exposure apparatus, if an inert gas is blown into the space between the projection optical system and the substrate, fluctuation is induced in the atmosphere by variation of the gas flow velocity or other cause, which may result in an error in values measured by the above-described various measuring systems (focus detecting system, alignment system and interferometer) that use measuring light passing through the space between the projection optical system and the substrate or somewhere around it.

A first object of the present invention is to provide a projection exposure apparatus in which a hermetic space extending from a light source of an illumination optical system to the mask-side end of a projection optical system is divided into a plurality of hermetic blocks, each having an inert gas sealed therein, by using a plurality of partition devices with respective openings in place of a plurality of windows as used in the conventional apparatus, thereby enabling only a desired block to be opened, and thus making it possible to eliminate waste of a replacement gas and to prevent loss of exposure light intensity which would otherwise be caused by a plurality of windows.

A second object of the present invention is to provide a projection exposure apparatus which is arranged as described above and in which the space between the substrate-side end of the projection optical system and a substrate is defined as a hermetic space having an inert gas sealed therein by a predetermined hermetically sealing device, thereby making it possible to eliminate the influence of fluctuation which has heretofore been induced in the atmosphere near the optical path of measuring light used by various optical measuring sensors when an inert gas is blown into the space between the projection optical system and the substrate.

A third object of the present invention is to provide an exposure apparatus and an optical system for such an exposure apparatus, in which a time period required for replacing air by inert gas in a frame during the maintenance can be reduced and the replacing operation can easily be performed.

SUMMARY OF THE INVENTION

To attain the first object thereof, the present invention provides a first projection exposure apparatus including an illumination optical system for applying light of a specific wavelength to a mask formed with a pattern, and a projection optical system for projecting a pattern image of the illuminated mask onto a substrate. The projection exposure apparatus further includes a hermetically sealing device for shutting off from the atmosphere an optical path extending from a light source of the illumination optical system to the mask-side end of the projection optical system, and a partition device for partitioning the space in the hermetically sealing device to form hermetic blocks as occasion demands.

According to a preferred embodiment of the above-described first apparatus, the partition device has a partition wall which is approximately perpendicular to the optical path, and a device for hermetically closing an opening provided in the partition wall at a position coincident with the optical path as occasion demands.

According to the first projection exposure apparatus of the present invention, the optical path extending from the light source in the illumination optical system to the mask-side end of the projection optical system is shut off from the atmosphere by the hermetically sealing device. Further, the space in the hermetically sealing device can be partitioned by a plurality of partition devices to form a plurality of hermetic blocks as occasion demands.

Accordingly, it is unnecessary to provide a plurality of windows which have heretofore been needed for partition, and it is possible to open only a desired block containing a constituent member necessary to repair or adjust in the space hermetically sealed by the hermetically sealing device to the atmosphere by remote control, for example. Thus, it is possible to minimize the waste of a replacement gas at the time of repairing or adjusting a constituent member and to rapidly replace the air by the replacement gas again.

More specifically, the partition device may comprise, for example, a partition wall which is approximately perpendicular to the optical path, and a closing member for hermetically closing an opening provided in the partition wall at a position coincident with the optical path as occasion demands. When measurement of the irradiation dose of illuminating light from the light source reveals that the output of the light source has become excessively large through some mistake, the optical path is shut off by closing the opening that is closest to the light source. By doing so, damage to an optical member can be prevented.

A second projection exposure apparatus of the present invention for attaining the second object of the present invention includes a light source (1) for emitting illuminating light including a wave band having absorbability with respect to oxygen (i.e., light IL having a center wavelength of 193.4 nm and a wave bandwidth of the order of from 193.0 nm to 193.8 nm, or light IL having a center wavelength of 193.4 nm and a wave bandwidth narrowed to several tens of pm), an illumination optical system (9a to 9c, 3, etc.) for applying the light from the light source to a mask (4) formed with a pattern, and a projection optical system (12) for forming a pattern image of the illuminated mask onto a substrate (5). The projection exposure apparatus further includes a gas supply system (10) for supplying an optical path extending over from the illumination optical system to the projection optical system with an inert gas having lower absorption characteristics than oxygen with respect to the wave band of the illuminating light, and a hermetically sealing device (18) which is disposed in the space between the substrate-side end of the projection optical system and the neighborhood of the substrate for replacing almost all atmosphere existing in the optical path of illuminating light in that space by a substance (an inert gas, e.g., nitrogen) other than oxygen.

According to a first preferred embodiment of the above-described second apparatus, the hermetically sealing device has a partition wall (19) for shutting off the space from the atmosphere, and a transparent member (16c) for transmitting illuminating light, and the gas supply system supplies the inert gas into a hermetic space which is formed by the partition wall and the transparent member.

According to a second preferred embodiment of the second apparatus, the apparatus further includes a focus detecting system (14 and 15) in which measuring light is incident obliquely on a substrate surface through the hermetic space formed by the hermetically sealing device, and the reflected light from the substrate is received through the hermetic space, thereby optically detecting the heightwise position of the substrate. The hermetically sealing device has a first light-transmitting portion (16a) for transmitting the measuring light entering it toward the substrate, and a second light-transmitting portion (16b) for transmitting the measuring light reflected from the substrate surface.

According to a third preferred embodiment of the second apparatus, the transparent member is a member for adjusting image formation characteristics of the projection optical system.

According to a fourth preferred embodiment of the second apparatus, the gas supply system supplies the inert gas into the hermetically sealing device and also adjusts the refractive index of the inert gas in the hermetically sealing device.

According to a fifth preferred embodiment of the second apparatus, the hermetically sealing device consists essentially of a transparent device (16c) which transmits the illuminating light.

According to the above-described second projection exposure apparatus of the present invention, it is possible to minimize the absorption of exposure light by oxygen and the generation of ozone even if far ultraviolet light (light including a wave band having absorbability with respect to oxygen)- is used as exposure light. Further, if light used for various kinds of measurement passes through the space between the projection optical system and the substrate or the neighborhood of the space, there is no error in measurement as has heretofore been caused by fluctuation in the atmosphere.

According to the above-described first preferred embodiment, the hermetically sealing device has a partition wall (19) for shutting off the space from the atmosphere, and a transparent member (16c) for transmitting illuminating light, and the gas supply system supplies an inert gas into the hermetic space formed by the partition wall and the transparent member. Therefore, the undesired absorption of light by oxygen is reduced.

According to the above-described second preferred embodiment, the hermetically sealing device has a first light-transmitting portion (16a) for transmitting measuring light entering the space toward the substrate, and a second light-transmitting portion (16b) for transmitting measuring light reflected from the substrate surface. Therefore, it is possible to use an optical, oblique incident focus detecting system despite the provision of the hermetically sealing device, and the focus detecting system is free from a measuring error due to fluctuation in the atmosphere.

According to the above-described third and fourth preferred embodiments, it is possible to solve the problem of the absorption of exposure light by oxygen and to adjust image formation characteristics of the projection optical system simultaneously.

According to the above-described fifth preferred embodiment, it is unnecessary to use an inert gas because the hermetically sealing device consists essentially of a transparent member (16c) which transmits illuminating light.

To achieve the third object of the present invention, an optical system for an exposure apparatus may have one of the following constructions.

According to a first preferred aspect of an optical system for achieving the third object, the optical system is applied to an exposure apparatus in which a plurality of optical parts (202, 203, 204, 205, 206, 210, 211 and 207–209) are contained in a frame 241, and the frame 241 is divided into a plurality of chambers 242a–242g, and the plurality of optical parts are housed in the different chambers of the frame 241, and gas replacing means 224, 248a–248g, L202a–L202g for replacing gases in the respective chambers 242a–242g are provided.

According to a second preferred aspect, the optical system is applied to an exposure apparatus in which a plurality of optical parts (202, 203, 204, 205, 206, 210, 211 and 207–209) are contained in a frame 241, and the frame 241 is provided with a plurality of chambers 242a–242g interconnected through connection passages L201b–L201g, and the plurality of optical parts are housed in the different chambers 242a–242g of the frame 241, and there are provided a gas supply means 224 for supplying inert gas to a first chamber 241a disposed at one end of the group of the interconnected chambers 242a–242g and a discharge passage L201h for discharging gas from a second chamber 242g disposed at the other end of the group of the interconnected chambers 242a–242g, and lids 244a–244g and valves 245a–245g, 246a–246g for blocking the communication between the adjacent chambers through the connection passages L201b–L201g when the lids 244a–244g are opened and for permitting the communication between the adjacent chambers through the connection passages when the lids 244a–244g are closed are provided in association with at least one of the chambers 242a–242g.

According to a third preferred aspect, there are provided oxygen density sensors 247a–247g for detecting density of oxygen in chambers 242a–242g having lids 244a–244g; and discharge switching means 248a, L202a, 248b, L202b, 248c, L202c, 248d, L202d, 248e, L202e, 248f, L202f, 248g, L202g disposed between the chambers 242a–242f and connection passages L201b–L201g at the second chamber 242g side, respectively, and for permitting discharge of gas into the adjacent chambers through the connection passages L201b–L201g at the second chamber 242g side when the oxygen density detected by the oxygen density sensors 247a–247g is less than a predetermined value and for discharging the gas in the chambers 242a–242g out of the frame 241 when the oxygen density is greater than the predetermined value.

According to a first aspect of an exposure apparatus for achieving the third object of the present invention, there are provided a flow rate sensor 249 for detecting a flow rate of gas discharged from a discharge passage L201h, and a control device for controlling to turn OFF a light source of the exposure apparatus when the flow amount detected by the flow rate sensor 249 is less than a predetermined value.

According to a fourth aspect of the optical system for the exposure apparatus, the optical system is applied to an exposure apparatus in which a plurality of optical parts (206, 207–209, 210, 211) are contained in a frame 241, and the frame 241 is divided into a plurality of chambers 242e–242g, and the plurality of optical parts are housed in the different chambers 242e–242g of the frame 241, and gas supply means 224, L204 for supplying inert gas to the chambers 242e–242g are provided, and, further, there are provided lids 244e–244g, a discharge passage L203 for discharging the gases in the chambers 242e–242g, valves 245e–245g for blocking supply of inert gas from the gas supply means 224, L204 when the lids 244e–244g are opened and for permitting the supply of inert gas from the gas supply means 224, L204 when the lids 244a–244g are closed, oxygen density sensors 247e–247g for detecting oxygen density in the chambers 242e–242g, and discharge switching means 248e, L202e, 248f, L202f, 248g, L202g disposed between the chambers 242e–242g and the discharge passage L203 and for permitting discharge of gas from the discharge passage L203 when the oxygen density detected by the oxygen density sensors 247e–247g is less than a predetermined value and for discharging the gas from the frame 241 when the oxygen density is greater than the predetermined value.

According to a second aspect of the exposure apparatus, the exposure apparatus has the optical system according to any one of the above-mentioned first to fourth aspects.

Incidentally, while Figures illustrating various embodiments were used for facilitating the understanding of the present invention, the present invention is not limited to such embodiments.

BRIEF DESCRIPTION OF THE DRAWINGS

FIG. 10 is a view for explaining replacement of gas during maintenance, where

FIG. 12 is a view for explaining replacement of gas during maintenance of an apparatus of FIG. 11, where

DESCRIPTION OF THE PREFERRED EMBODIMENTS

A first embodiment of the present invention will be described below with reference to FIGS. 1 to 3 in the accompanying drawings.

Figure 1:
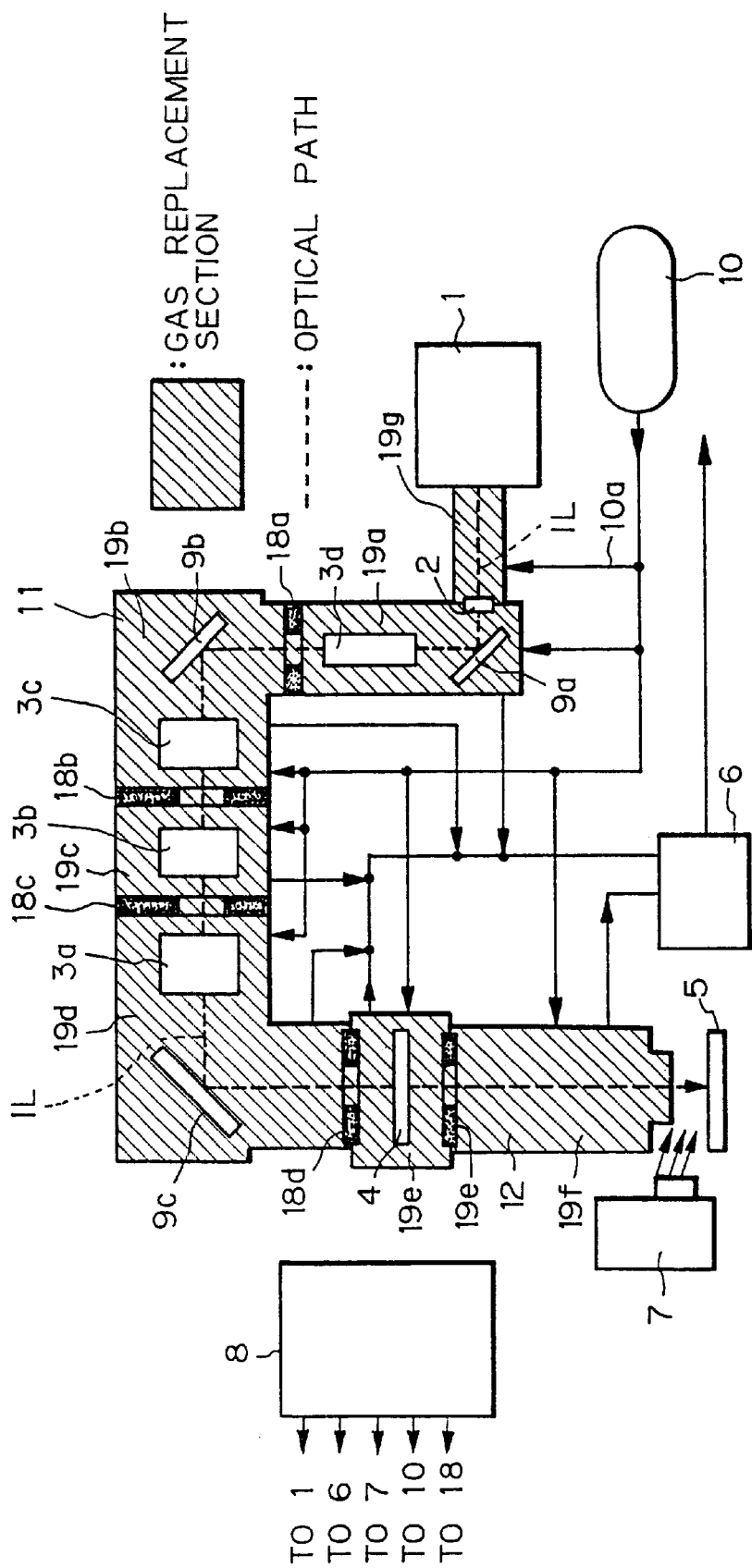
FIG. 1 schematically shows the arrangement of a projection exposure apparatus according to a first embodiment of the present invention.

FIG. 1 schematically shows the arrangement of a projection exposure apparatus according to a first embodiment of the present invention.

The projection exposure apparatus shown in FIG. 1 has a light source 1 (an excimer laser using ArF as a medium) which emits far ultraviolet light, for example. Exposure light IL emitted from the light source 1 passes through a window 2 made of a material having a high transmittance, e.g., quartz, and is then incident on a mirror 9a. The incident light is reflected by the mirror 9a upwardly as viewed in the figure. The reflected light passes through an optical member 3d and is then reflected by a mirror 9b leftwardly as viewed in the figure.

The reflected light from the mirror 9b passes through optical members 3c, 3b and 3a, which include a fly-eye lens, etc., for example, to become a bundle of parallel rays of approximately uniform illuminance. The exposure light IL, which is now in the form of a parallel ray bundle, is reflected by a mirror 9c downwardly as viewed in the figure to illuminate a mask 4 formed with a pattern. Thus, the light source 1, the optical members 3a to 3d, and the mirrors 9a to 9c constitute an illumination optical system.

The exposure light IL passing through the mask 4 is projected onto a photosensitive substrate 5 through a projection optical system 12. Thus, a bright-and-dark pattern image of the pattern on the mask 4 is formed on the substrate 5.

It should be noted that an inert gas, e.g., nitrogen, is blown into the space between the projection optical system 12 and the substrate 5 at a constant flow velocity by a gas blowing device 7. Thus, the atmosphere in the optical path of exposure light from the projection optical system 12 is substantially replaced by the inert gas, thereby pre-venting far ultraviolet light used as exposure light from being absorbed by oxygen or from generating ozone. In a case where measuring light which is used by various optical measuring sensors passes through the space between the projection optical system 12 and the substrate 5 as in a second embodiment (described later) shown in FIGS. 5 to 7, it is preferable not only to blow an inert gas but also to hermetically seal the space by a hermetically sealing device in order to eliminate the influence of fluctuation induced in the atmosphere by blowing of the inert gas.

Incidentally, as shown by the hatching in the figure, an optical path which extends from the light source 1 to the mask-side end of the projection optical system 12 is entirely surrounded by a hermetically sealing device 11 so as to be shut off from the atmosphere. The hermetically sealing device 11 is provided therein with a window 2 and five partition devices 18a to 18e so that a total of seven blocks 19a to 19g are formed in the hermetically sealing device 11.

That is, a hermetic block 19a which is partitioned by the window 2 and the partition device 18a accommodates the mirror 9a and the optical member 3d, and a hermetic block 19b which is partitioned by the partition device 18a and the partition device 18b accommodates the mirror 9b and the optical member 3c.

Further, a hermetic block 19c which is partitioned by the partition device 18b and the partition device 18c accommodates the optical member 3b, and a hermetic block 19d which is partitioned by the partition device 18c and 7the partition device 18d accommodates the optical member 3a and the mirror 9c.

Further, a hermetic block 19e which is partitioned by the partition device 18d and the partition device 18e accommodates the mask 4, a mask stage (not shown), etc., and a hermetic block 19f which is formed by the partition device 18e at an end of the hermetically sealing device 11 which is closer to the substrate 5 accommodates the projection optical system 12.

It should be noted that a substantially hermetic block 19g is formed between the light source 1 and the window 2. Every block except the substantially hermetic block 19g is connected with a vacuum pump 6 through a piping. All the blocks, including the hermetic block 19g, are each connected with a gas supply device 10 through a piping.

Thus, gas replacement can be carried out for each of the blocks 19a to 19f by evacuating each block with the vacuum pump 6 and, thereafter, supplying it with an inert gas, e.g., nitrogen, by the gas supply device 10.

It should be noted that it is difficult for the hermetic block 19g to ensure a completely hermetic state in a case where the joint of the block 19g and the light source 1 has a mechanism which enables the block 19g to be detached from the light source 1 when repairs or adjustment is needed. However, the volumetric capacity of the hermetic block 19g can be minimized by properly determining the position of the window 2. Therefore, gas replacement can be carried out simply by supplying an inert gas at a predetermined pressure without forced exhaust. However, the hermetic block 19g may be joined to the light source 1 such that a completely hermetic space is formed therein, and forced exhaust may be carried out also in the hermetic block 19g. Alternatively, the system may be arranged such that a gas is circulated between the hermetic block 19g and a piping 10a (see FIG. 1).for supplying a gas to the hermetic block 19g.

In any case, it is preferable for any of the blocks 19a to 19g to be continuously supplied with an inert gas from the gas supply device 10 after the completion of gas replacement.

It should be noted that the light source 1, the vacuum pump 6, the gas supply device 10, the gas blowing device 7 and each partition device 18 are controlled by a controller 8.

Figure 4:
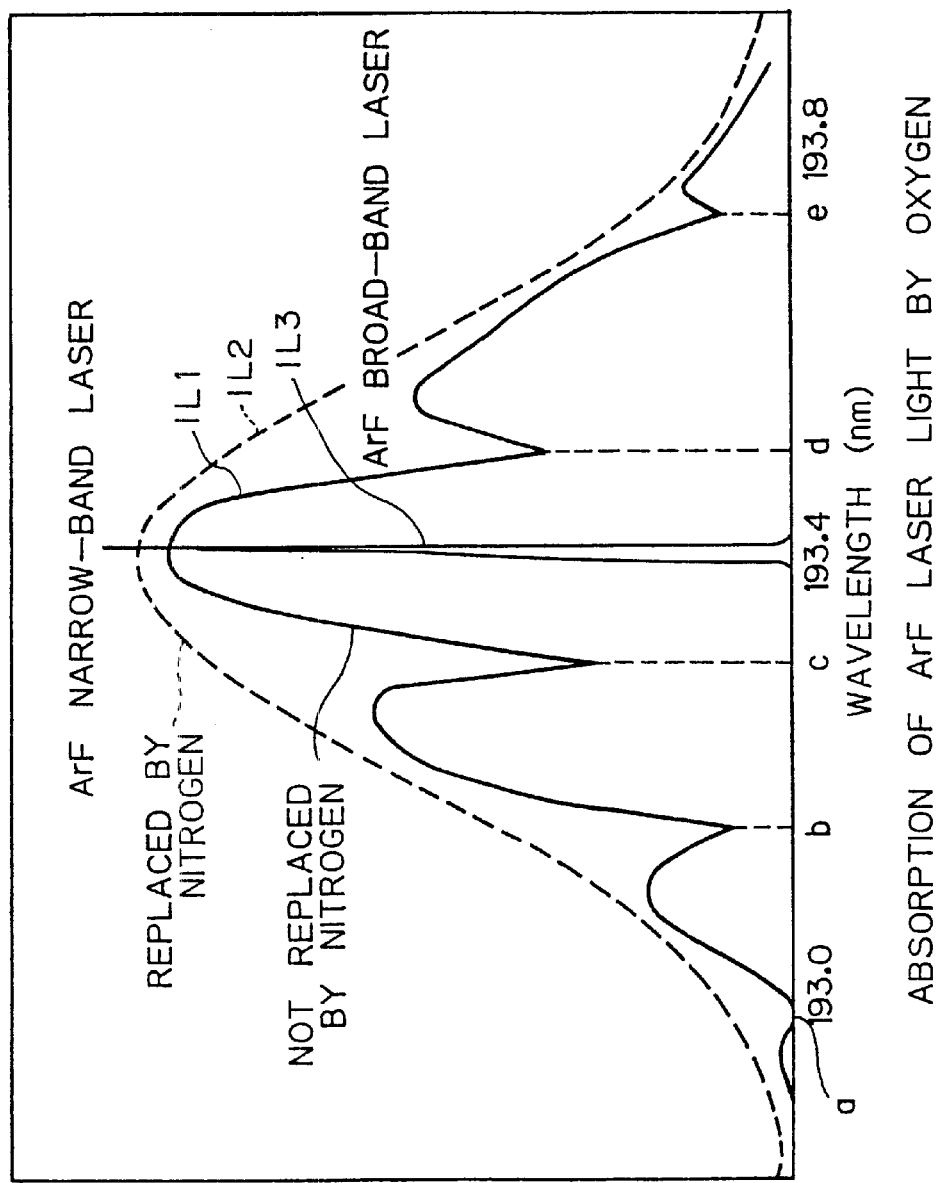
FIG. 4 is a graph showing differences in absorption characteristics between air and nitrogen in the wave band of far ultraviolet light.

Next, the absorption of far ultraviolet light will be explained with reference to FIG. 4. FIG. 4 shows a comparison of the intensity of ArF excimer laser light in a case where the atmosphere in an optical path of ArF excimer laser light was replaced by nitrogen and the ArF excimer laser light intensity in a case where the atmosphere was not replaced by nitrogen (i.e., a case where the optical path of ArF excimer laser light was placed in the air). In FIG. 4, the abscissa axis represents wavelength (nm), and the ordinate axis represents the intensity of ArF excimer laser light.

As shown in FIG. 4, laser light IL from an excimer laser has a center wavelength of 193.4 nm and a wave bandwidth of from 193.0 nm to 193.8 nm (i.e., not narrow-band but broad-band laser light). The curve IL1, which represents the laser light intensity measured with the atmosphere not replaced by nitrogen (i.e., the optical path placed in the air), lowers in a wave bandwidth of the order of from 193.0 mm to 193.8 nm, and particularly lowers to a considerable extent at specific wavelengths (spectrum) in that bandwidth. This is because oxygen has characteristics to absorb light in the wave bandwidth of from 193.0 nm to 193.8 nm, particularly light of specific wavelengths (spectrum; shown by reference symbols a to e in FIG. 4) in that bandwidth.

In contrast, the curve IL2, which represents the laser light intensity measured with the atmosphere replaced by nitrogen, reveals that nitrogen absorbs light in the wave bandwidth of the order of from 193.0 nm to 193.8 nm less than oxygen, and that nitrogen has no characteristic to absorb light of specific wavelengths (spectrum) in that bandwidth to a considerable extent. Thus, by replacing the atmosphere in the optical path, through which far ultraviolet light having a specific wave band passes, by an inert gas whose absorption characteristic with respect to light having the specific wave band is lower than that of oxygen, it is possible to reduce the loss of light intensity caused by the absorption of light by oxygen and to prevent the generation of ozone (which is caused by the absorption of light by oxygen).

It should be noted that FIG. 4 also shows the light intensity curve IL3 of ArF narrow-band laser light having a wave bandwidth of from several pm to several tens of pm and a center wavelength of 193.4 nm. Oxygen also has absorption characteristics with respect to the ArF narrow-band laser light (wavelength: 193.4 nm). Therefore, in the case of such ArF narrow-band laser light also, it is necessary to replace the atmosphere in the optical path extending from the light source 1 to the substrate-side end of the projection optical system 12 (i.e., the blocks 19a to 19f) by an inert gas, e.g., nitrogen. Further, if an inert gas hermetically sealing space 118a (see FIG. 6) or a transparent member 31 (FIG. 7) is provided between the projection optical system 12 and the substrate 5 to shut off (hermetically seal) the greater part of the optical path of exposure light IL from the atmosphere, as in embodiments shown in FIGS. 5 to 7, it is possible to suppress the absorption of exposure light IL by oxygen even more effectively and to minimize problems (light intensity loss and ozone generation) arising from the absorption of exposure light IL.

Figure 2:
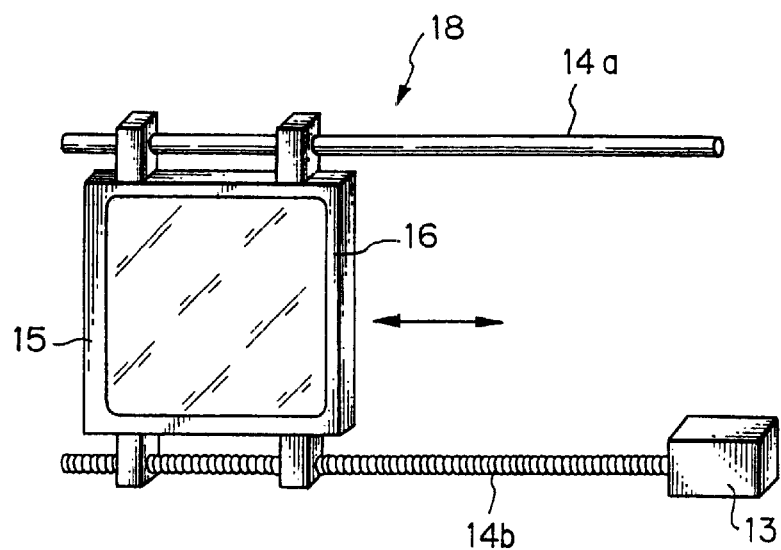
FIG. 2 is a perspective view showing in detail the arrangement of a closing device for a hermetically sealing device in the projection exposure apparatus shown in FIG. 1.

FIG. 2 is a perspective view showing the arrangement of a door 15 serving as a closing device used in each partition device 18 shown in FIG. 1. FIG. 3 is a perspective view showing the whole arrangement of a partition device 18 in the apparatus shown in FIG. 1.

Figure 3:
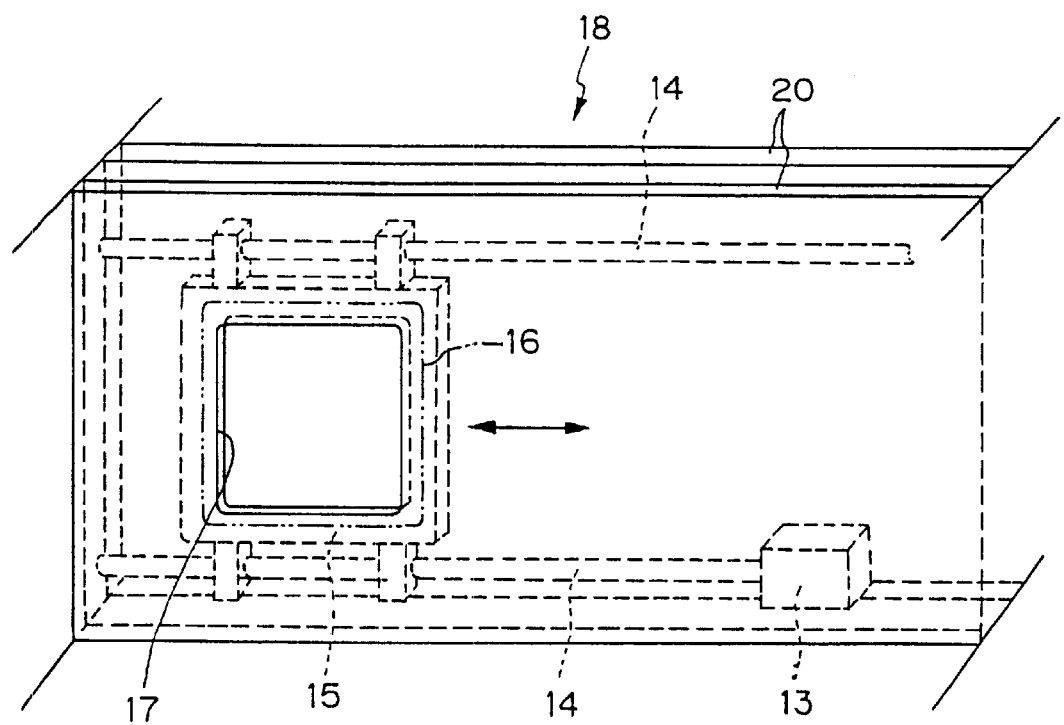
FIG. 3 is a perspective view showing in detail the arrangement of the hermetically sealing device in the projection exposure apparatus shown in FIG. 1.

As illustrated in FIG. 3, the partition device 18 has a double partition wall 20 which is approximately perpendicular to the optical path. The double partition wall 20 has a pair of coaxial openings 17 which are formed at a position coincident with the optical path. Each peripheral portion of the double partition wall 20 is hermetically connected to a side wall of the above-described hermetically sealing device 11.

It should be noted that the partition wall 20 does not necessarily need to have a double structure. However, it is preferable for the partition wall 20 to have a double structure with a view to effectively resisting the force applied thereto by evacuation.

The partition device 18 further has a door 15 provided in the double partition wall 20. The door 15 serves as a closing device which is capable of closing and hermetically sealing the openings 17 as occasion demands. As shown in FIG. 2, the door 15 is supported by a pair of parallel guide members 14a and 14b. One guide member 14a is a bar member with a smooth surface. The door 15 is mounted on the smooth guide member 14a so as to be slidable in the axial direction of the guide member 14a.

The other guide member 14b is a bar member with a threaded surface. The door 15 is engaged with the threaded guide member 14b. One end of the threaded guide member 14b is joined to an output shaft of a motor 13 for driving the threaded guide member 14b to rotate.

Thus, by properly rotating the motor 13 back and forth, the threaded guide member 14b is driven to rotate, thereby causing the door 15 to move reciprocally along the axis of the guide member 14a, as shown by the arrow in the figure. Thus, the openings 17 of the double partition wall 20 can be closed and hermetically sealed by the door 15 as occasion demands. More specifically, during projection exposure, the door 15 lies off from the openings 17. Therefore, exposure light IL efficiently passes through the openings 17 without attenuation which might otherwise be caused by the presence of a window or the like. When the optical member 3c needs repairs or adjustment, the door 15 is moved to close the openings 17, thereby allowing only one block 19b to be opened to the atmosphere. After the repairs, the block 19b is shut off from the atmosphere, and then gas replacement is carried out again. When projection exposure is to be carried out, the door 15 is moved off from the openings 17.

It is preferable to form abutments 16 of a rubber material, for example, on both sides of the door 15 so that the hermetic sealing properties of the hermetic block 19b are further improved by cooperation of the abutments 16 and the inner wall surfaces of the double partition wall 20, thereby enabling gas leakage to be reliably prevented.

Thus, in the projection exposure apparatus according to this embodiment, the optical path extending from the light source of the illumination optical system to the mask-side end of the projection optical system is shut off from the atmosphere by the hermetically sealing device 11, and the space 20 in the hermetically sealing device 11 can be partitioned by a plurality of partition devices 18 to form a plurality of hermetic blocks 19 (19a to 19g).

Further, in the projection exposure apparatus according to this embodiment, only a block containing a constituent member which needs repairs or adjustment needs to be opened to the atmosphere and subjected to gas re-replacement. Accordingly, it is possible to minimize the waste of the replacement gas and to carry out gas re-replacement rapidly.

It is also preferable to measure and monitor the irradiation dose of illuminating light by leading a part of illuminating light from the light source 1 to a proper photodetector by use of a branch mirror, for example, although the illustration of such an arrangement is omitted. When the irradiation dose of illuminating light has exceeded a predetermined value through some mistake, the openings 17 of the partition device 18a, which is the closest to the light source 1, is closed to cut off the optical path, thus preventing damage to the optical members located behind the partition device 18a.

Although in the above-described embodiment the window 2 is provided between the blocks 19g and 19a, it should be noted that the window 2 may be replaced by a partition device. In such a case, there is no window through which illuminating light passes, and illuminating light merely passes through the openings 17 of a plurality of partition devices 18. Therefore, it is possible to completely avoid a loss of illuminating light intensity due to a window.

Further, although in the foregoing embodiment the present invention has been described with regard to a projection exposure apparatus that uses far ultraviolet light as a light source, the present invention is also applicable to a projection exposure apparatus that uses light of other specific wavelength which is absorbed by oxygen to a larger extent than by inert gases.

Next, a second embodiment of the present invention will be described with reference to FIGS. 5 and 6. It should be noted that in FIGS. 5 and 6 the same members or portions as those in FIG. 1 are denoted by the same reference numerals, and description thereof is properly omitted.

Figure 5:
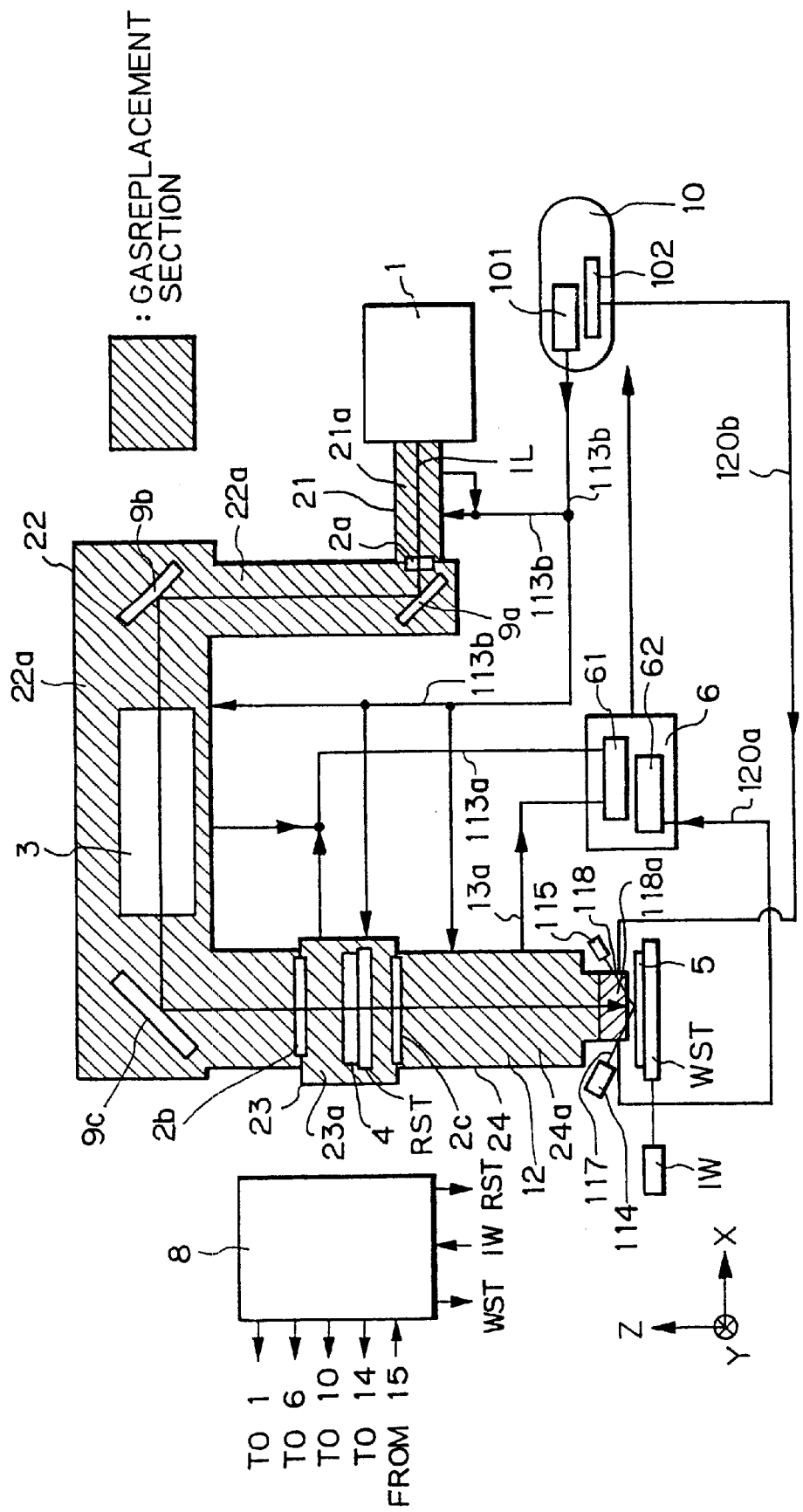
FIG. 5 schematically shows the whole arrangement of a projection exposure apparatus according to a second embodiment of the present invention.

FIG. 5 schematically shows the whole arrangement of a projection exposure apparatus according to the second embodiment of the present invention. A light source 1 emits far ultraviolet light (light from an excimer laser using ArF as a medium). The light source 1 in this embodiment is provided with a member for narrowing the wave band of ArF excimer laser light by using an etalon, a diffraction grating, etc. Accordingly, exposure light from the light source 1 in this embodiment is narrow-band laser light of wavelength 193.4 nm like the exposure light IL3 shown in FIG. 4, described above.

The reason for narrowing the wave band of exposure light is that it is difficult to effectively correct chromatic aberration introduced by the projection optical system 12 (see FIG. 1) into broad-band excimer laser light owing-to problems in terms of processing optical glass materials (quarts, fluorite, etc.) capable of transmitting far ultraviolet light, and adhesives. Usually, laser light having a wave bandwidth narrowed to the order of several tens of pm by using an etalon, a diffraction grating, etc. is used to prevent the occurrence of a chromatic aberration problem associated with the projection optical system 12.

Exposure light IL emitted from the light source 1 passes through a window 2a (a member made of a material having a high transmittance, e.g., quartz) and is then incident on a mirror 9a. The exposure light IL is reflected by the mirror 9a upwardly as viewed in the figure and is then reflected by a mirror 9b leftwardly as viewed in the figure to enter an optical unit 3. The optical unit 3 has a relay lens, an optical integrator (fly-eye lens, etc.) for making the exposure light IL uniform, an input lens for making the exposure light IL incident on the optical integrator, and a relay lens and a condenser lens for converging the exposure light IL emanating from the optical integrator onto a reticle.

The exposure light IL emanating from the optical unit 3 in the form of a bundle of parallel rays is reflected by a mirror 9c downwardly as viewed in the figure. The exposure light IL reflected by the mirror 9c passes through a window 2b (a member made of a material having a high transmittance, e.g., quartz), and is incident on a mask 4 formed with a pattern which is to be photo-lithographically transferred onto a substrate 5. The mask 4 is approximately uniformly illuminated with the exposure light IL because the illuminance of the exposure light IL on the mask 5 is made approximately uniform by the optical integrator, the condenser lens, etc. The exposure light IL passing through the mask 4 passes through a window 2c (a member made of a material having a high transmittance, e.g., quartz) and a projection optical system 12, and is incident on a photosensitive substrate 5 to form a pattern image of the mask 4 on the substrate 5.

The substrate 5 is placed on a substrate stage WST which is movable in three-dimensional directions (directions X, Y and Z). A laser interferometric system IW measures the position in the XY-plane of the substrate stage WST with a predetermined resolution. The substrate stage WST is stepwisely moved on the basis of the value measured by the laser interferometric system IW. Thus, the pattern on the mask 4 is sequentially projected onto the substrate 5 by the step-and-repeat process in which stepping and exposure are repeated. The optical path of exposure light IL which extends from the light source 1 to the window 2b is hermetically sealed by hermetically sealing members 21 and 22 which are separate from each other. The mask 4 is hermetically sealed by an independent hermetically sealing member 23.

The projection optical system 12 usually includes a plurality of lens elements, and at least one lens tube 24 for retaining the lens elements. The lens elements are almost hermetically sealed off from the outside (atmosphere) by the lens tube 24 (i.e., the optical path of exposure light IL is hermetically sealed by the lens tube 24). The hermetically sealing members 21, 22 and 23 are not particularly limited, but may be tubular hermetically sealing members made of a metallic material, e.g., aluminum. The hermetically sealing members 21 and 22 are divided by the window 2a. The light source 1, the window 2a and the hermetically sealing member 21 form a hermetic space 21a (corresponding to the hermetic block 19g shown in FIG. 1).

The hermetically sealing members 22 and 23 are divided by the window 2b. The windows 2a and 2b and the hermetically sealing member 22 form a hermetic space 22a. The hermetically sealing member 23 and the lens tube 24 are divided by the window 2c. The windows 2b and 2c and the hermetically sealing member 23 form a hermetic space 23a. The window 2c and the lens tube 24 form a hermetic space 24a. In the hermetic space 22a, the mirrors 9a, 9b and 9c are disposed. In the hermetic space 23a, a mask stage RST is disposed. The mask stage RST is two-dimensionally movable with the mask 4 placed thereon, as shown in FIG. 5.

In the hermetic space 24a, the lens elements of the projection optical system 12 are disposed. It should be noted that the arrangements of the hermetic spaces 21a to 24a, which extend in series from the light source 1 to the substrate-side end of the projection optical system 12, and those of the windows 2a, 2b and 2c in the second embodiment are approximately similar to those disclosed in JP(A) 6-260385 except that the hermetic space 21a and the window 2a are additionally provided in the second embodiment. The windows 2b and 2c, which are provided at the boundaries between the three hermetic spaces 22a, 23a and 24a are not necessarily exclusive. The windows 2b and 2c may be replaced by a larger number of partition devices 18a to 18e than the number of windows 2b and 2c to divide the optical path into a plurality of hermetic blocks so that these hermetic blocks can be individually subjected to gas replacement as in the first embodiment shown in FIG. 1.

Next, a hermetically sealing member 118 is provided in the space between the projection optical system 12 and the substrate 5 so that substantially the whole optical path of exposure light IL from the projection optical system 12 to the neighborhood of the substrate 5 is hermetically sealed off from the outside (atmosphere). Further, the projection exposure apparatus shown in FIG. 5 is provided with a focus detecting system (114 and 115) for optically detecting the heightwise position (position in the direction Z) of the substrate 5. The focus detecting system comprises a light-projecting system 114 for making measuring light 117 incident obliquely on the substrate surface, and a light-receiving system 115 for receiving measuring light reflected from the substrate surface.

The light-receiving system 115 outputs a signal indicating the positional relationship between measuring light reflected at the substrate surface and light received by the light-receiving system 115 to a main controller 8. The main controller 8 moves the substrate stage WST in the height-wise direction (direction Z) on the basis of the signal from the light-receiving system 115 so that the surface of the substrate 5 is approximately coincident with the position of a pattern image of the mask 4 formed by the projection optical system 12. The main controller 8 generally controls the light source 1, the vacuum pump 6, the gas supply device 10, the movement in the directions X and Y of the substrate stage WST, the movement of the mask stage RST, etc.

Figure 6:
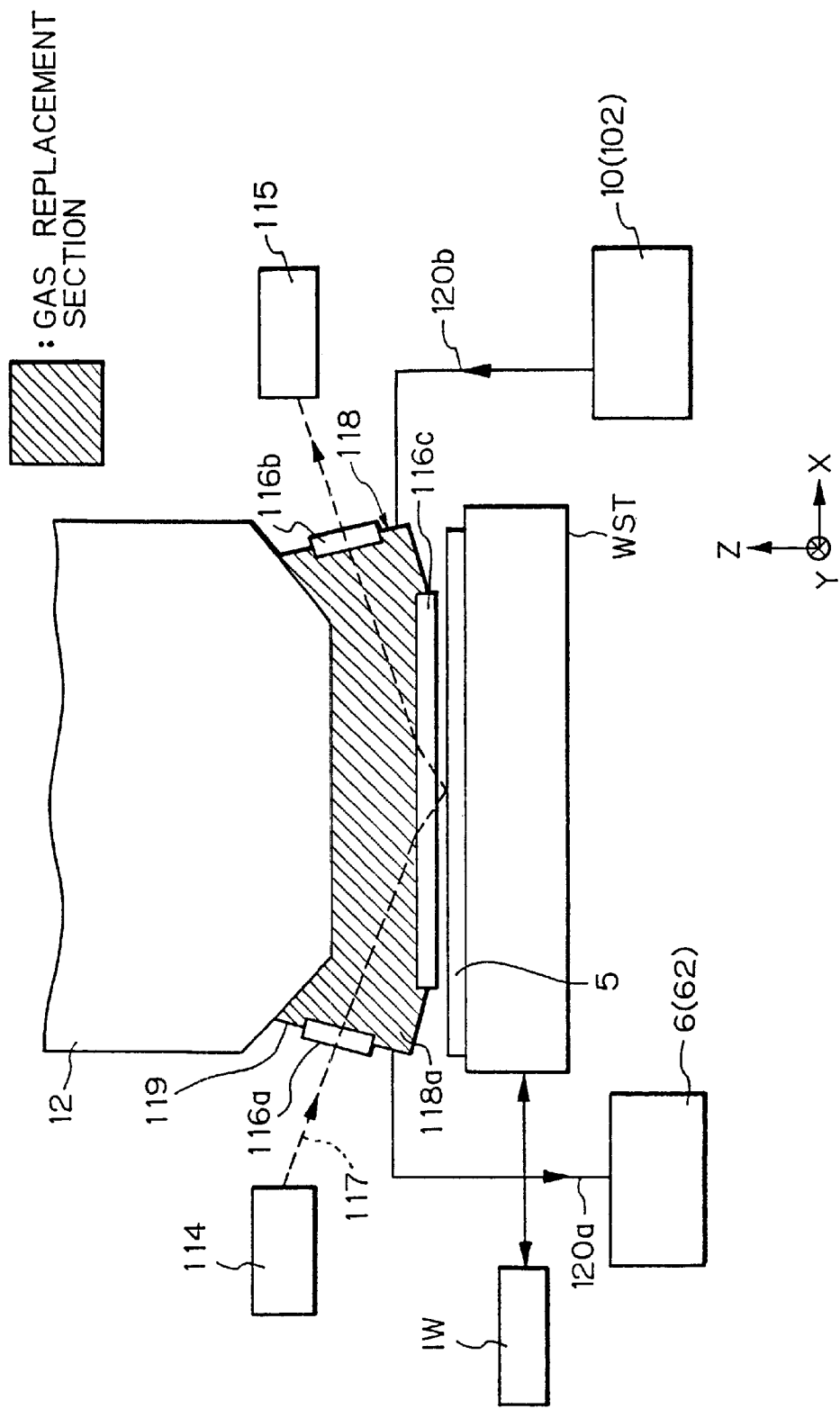
FIG. 6 is an enlarged view showing a projection optical system and a substrate in the apparatus shown in FIG. 5.

FIG. 6 is an enlarged view showing the hermetically sealing member 118 in detail. The hermetically sealing member 118 includes a tubular partition wall 119 (e.g., a tubular partition wall. made of a proper metallic or other material) which extends from the projection optical system 12 to the neighborhood of the substrate 5 along the optical path of exposure light IL, windows 116a and 116b (transparent members made of a material which transmits measuring light 117, e.g., quartz) which are provided in the side wall of the partition wall 119, and a transparent member 116c (made of quartz, for example) which transmits exposure light IL. The partition wall 119, the windows 116a and 116b, and the transparent member 116c form a hermetic space 118a.

Measuring light 117 from the light-projecting system 114 of the focus detecting system passes through the window 116a (a transparent member made of a material which transmits measuring light 117, e.g., quartz), the hermetic space 118a, the transparent member 116c, and the atmosphere in the space between the transparent member 116c and the substrate 5, and is incident on the surface of the substrate 5. Measuring light 117 reflected at the surface of the substrate 5 passes through the atmosphere between the transparent member 116c and the substrate 5, the transparent member 116c, the hermetic space 118a, and the window 116b and enters the light-receiving system 115. The distance between the transparent member 116c and the substrate 5 is exceedingly small; therefore, an amount of exposure light IL absorbed by oxygen in the atmosphere between the transparent member 116c and the substrate 5 is extremely small.

The distance between the transparent member 116c and the substrate 5 should be set, for example, at about double the distance through which the substrate stage WST is vertically movable along the Z-axis on the basis of the signal from the focus detecting system (i.e., a pre-determined drivable range of the substrate stage WST), or at about 2 to 3 times the practical focal depth (e.g., a total of 20 μm) of the projection optical system 12.

Referring to FIG. 5, the vacuum pump 6 comprises vacuum pumps 61 and 62. The vacuum pump 61 is connected to each of the hermetic spaces 22a, 23a and 24a through a piping 113a. The vacuum pump 62 is connected to the hermetic space 118a through a piping 120a. The main controller 8 controls the vacuum pump 61 for evacuating air from the hermetic spaces 22a, 23a and 24a and the vacuum pump 62 for evacuating air from the hermetic space 118a independently of each other.

The gas supply device 10 comprises gas supply devices 101 and 102. The gas supply device 101 supplies an inert gas (e.g., nitrogen, helium, etc.) having low absorption characteristics with respect to far ultraviolet light of wavelength 200 nm or less (in this embodiment, laser light emitted from the excimer laser light source 1 and having a wave bandwidth of from 193.0 nm to 193.8 nm) in comparison to oxygen to each of the hermetic spaces 22a, 23a and 24a through a piping 113b. The gas supply device 102 supplies the inert gas to the hermetic space 118a through a piping 120b independently of the gas supply device 101. The main controller 8 controls the gas supply devices 101 and 102 independently of each other.

Regarding the absorption of far ultraviolet light, the same analysis as has already been made in connection with FIG. 4 also applies in the second embodiment. That is, exposure light IL1, which is passed through an optical path in which the atmosphere has been replaced by an inert gas, generally has a higher intensity and is more favorable than exposure light IL3, passed through an optical path in which the atmosphere is not replaced by an inert gas because the exposure light IL1 is not absorbed by oxygen. However, exposure light IL3 used in the second embodiment is ArF narrow-band laser light having a center wavelength of 193.4 nm. Oxygen also has absorption characteristics with respect to the ArF narrow-band laser light (wavelength: 193.4 nm). Therefore, it is necessary to replace the atmosphere in the optical path in the space extending from the light source 1 to the substrate-side end of the projection optical system 12 (the hermetic spaces 21a, 22a, 23a and 24a) by an inert gas, e.g., nitrogen. Further, in the second embodiment, the hermetic space 118a is provided between the projection optical system 12 and the substrate 5 by the hermetically sealing member 118 for shutting off (hermetically sealing) the greater part of the optical path of exposure light IL from the atmosphere. Therefore, it is possible to minimize problems (light intensity loss and ozone generation) caused by the absorption of exposure light IL by oxygen.

Next, a method of replacing the atmosphere (oxygen) in each of the hermetic spaces 21a, 22a, 23a, 24a and 118a by the above-described inert gas will be explained. Gas replacement for the hermetic spaces 22a, 23a, 24a and 118a is carried out as follows: The atmosphere in the hermetic spaces 22a, 23a and 24a is evacuated by the vacuum pump 61 through the piping 113a, and thereafter, the inert gas is supplied at a predetermined pressure to the hermetic spaces 22a, 23a and 24a from the gas supply device 101 through the piping 113b. Meanwhile, the atmosphere in the hermetic space 118a is evacuated by the vacuum pump 62 through the piping 120a, and thereafter, the inert gas is supplied at a predetermined pressure to the hermetic space 118a from the gas supply device 102 through the piping 120b.

It should be noted that it is preferable to continue the supply of the inert gas from the gas supply device 101 (102) and the evacuation of the gas through the piping 113a (120a) even after the completion of the gas replacement. On the other hand, gas replacement for the hermetic space 21a can be effected simply by supplying it with the inert gas from the gas supply device 101 in small quantities (for example, the inert gas may be kept flowing) without forcedly exhausting the atmosphere from the hermetic space 21a because it has a relatively small volumetric capacity like the hermetic block 19g in FIG. 1. However, forced exhaust of the atmosphere may be carried out also in the hermetic space 21a.

The hermetic space 118a requires only a volumetric capacity which is sufficient to replace the atmosphere in the neighborhood of the optical path of exposure light IL in the space between the projection optical system 12 and the substrate 5. Therefore, the volumetric capacity of the hermetic space 118a may be smaller than those of other hermetic spaces (e.g., 22a and 23a). However, if the hermetic space 118a is simply supplied with a gas, the pressure in the hermetic space 118a undesirably changes. Therefore, the main controller 8 controls the gas supply device 102 so that the gas is continuously supplied to the hermetic space 118a through the piping 120b, and also controls the vacuum pump 62 so that the gas is continuously discharged through the piping 120a, thereby controlling the pressure in the hermetic space 118a at a desired constant level.

Thus, in the projection exposure apparatus according to the second embodiment, the optical path extending from the exposure light exit of the projection optical system 12 to a position immediately in front of the surface of the substrate 5 can be shut off from the atmosphere, and the atmosphere in the hermetic space 118a can be replaced by an inert gas. Accordingly, there is no change in the flow velocity of the inert gas in the optical path of measuring light used by the focus detecting system (114 and 115). Consequently, reproducibility is improved, and it is possible to realize position measurement of high accuracy. Usually, this type of projection exposure apparatus is provided with an interferometer that measures the position of the substrate stage WST by using laser light, and an alignment sensor that measures the position in the XY-plane of the substrate 5 by using laser light or the like. In this regard, the second embodiment does not employ a method of blowing an inert gas; therefore, there is no change in the flow velocity of the inert gas in the optical path of measuring light used by the interferometer and the alignment sensor in the vicinity of the substrate 5. Accordingly, reproducibility is improved, and it is possible to realize position measurement of high accuracy.

Further, the main controller 8 can adjust the image formation characteristics of the projection optical system 12 by controlling the gas supply device 102 such that the pressure in the hermetic space 118a is changed, or an inert gas to be supplied is changed to another that has a different refractive index, or the mixture ratio of a plurality of inert gasses having different refractive indices is changed. Further, the arrangement may be such that the gas supply device 101 can supply the gas to the hermetic spaces 23a and 24a independently of each other, and that the vacuum pump 61 can discharge the gas (or atmosphere) from the hermetic spaces 23a and 24a independently of each other. By doing so, the image formation characteristics of the projection optical system 12 can be adjusted when the mask 4 is exchanged for another by controlling the gas supply and discharge with respect to the hermetic space 23a through the main controller 8, and by controlling the refractive index of a gas in the hermetic space 24a through the main controller 8 (i.e., the gas supply device 101 is controlled such that the pressure in the hermetic space 24a is changed, or an inert gas to be supplied is changed to another that has a different refractive index, or the mixture ratio of a plurality of inert gasses having different refractive indices is changed).

Figure 7:
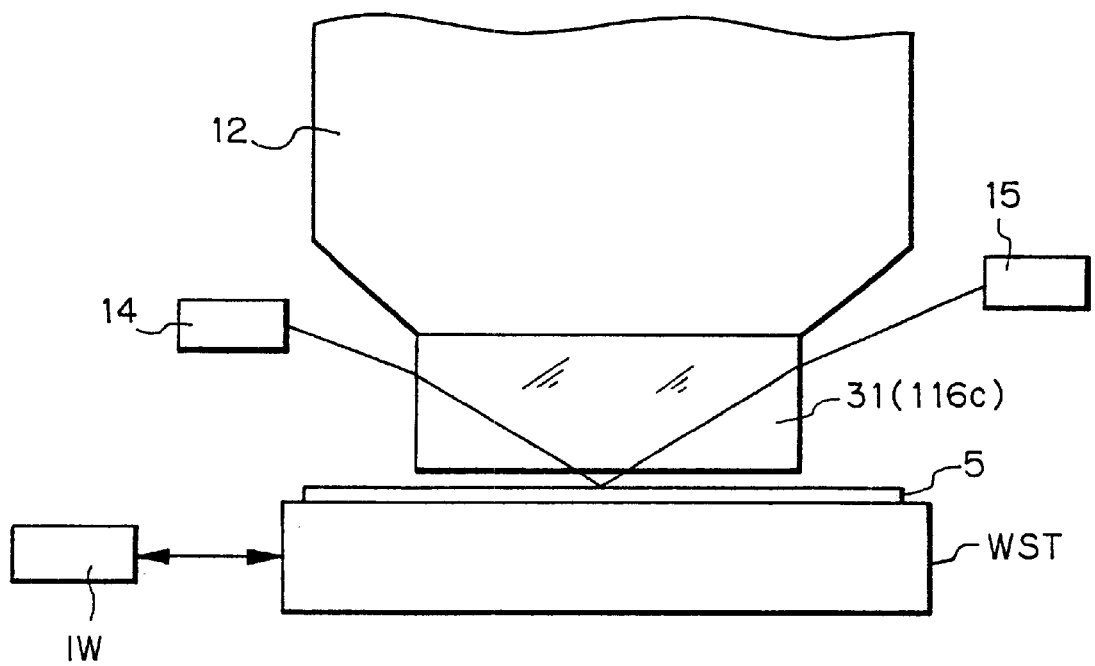
FIG. 7 shows a modification of the apparatus shown in FIG. 6.

It should be noted that, when helium is used as an inert gas, because, unlike nitrogen, helium has a refractive index considerably different from that of air, it is desirable to form the window 116c into a convex or concave shape so that a refractive power is given to the window 116c to correct the image formation characteristics of the projection optical system 12. As shown in FIG. 7, a transparent member (made of a transparent material, e.g., quartz) 31 which is similar to the window 116c may be provided in the space (containing the optical path of exposure light IL) between the substrate-side end of the projection optical system 12 and the substrate 5 so that the atmosphere in this space is replaced by the transparent member 31.

Although in the foregoing description one end of the hermetically sealing member 118 (see FIG. 6) or the transparent member 31 (see FIG. 7) is in close contact with the projection optical system 12, the hermetically sealing member 118 or the transparent member 31 may be provided apart from the projection optical system 12 by a distance approximately equal to the distance between the window 116c and the substrate 5 shown in FIG. 6. By doing so, it is possible to improve the working efficiency in exchanging or removing the hermetically sealing member 118 or the transparent member 31 for maintenance or other purposes.

Although in the first and second embodiments the present invention has been described with regard to a projection exposure apparatus that uses an ArF excimer laser as a light source, it should be noted that the present invention is also applicable to projection exposure apparatuses that use a light source which emits light including a wave band having absorbability with respect to oxygen. Examples of light that include a wave band having absorbability with respect to oxygen are third-order harmonics (wavelength: 170 nm) of YAG and copper-vapor lasers. The present invention can also be applied to step-and-scan projection exposure apparatuses.

Figure 8:
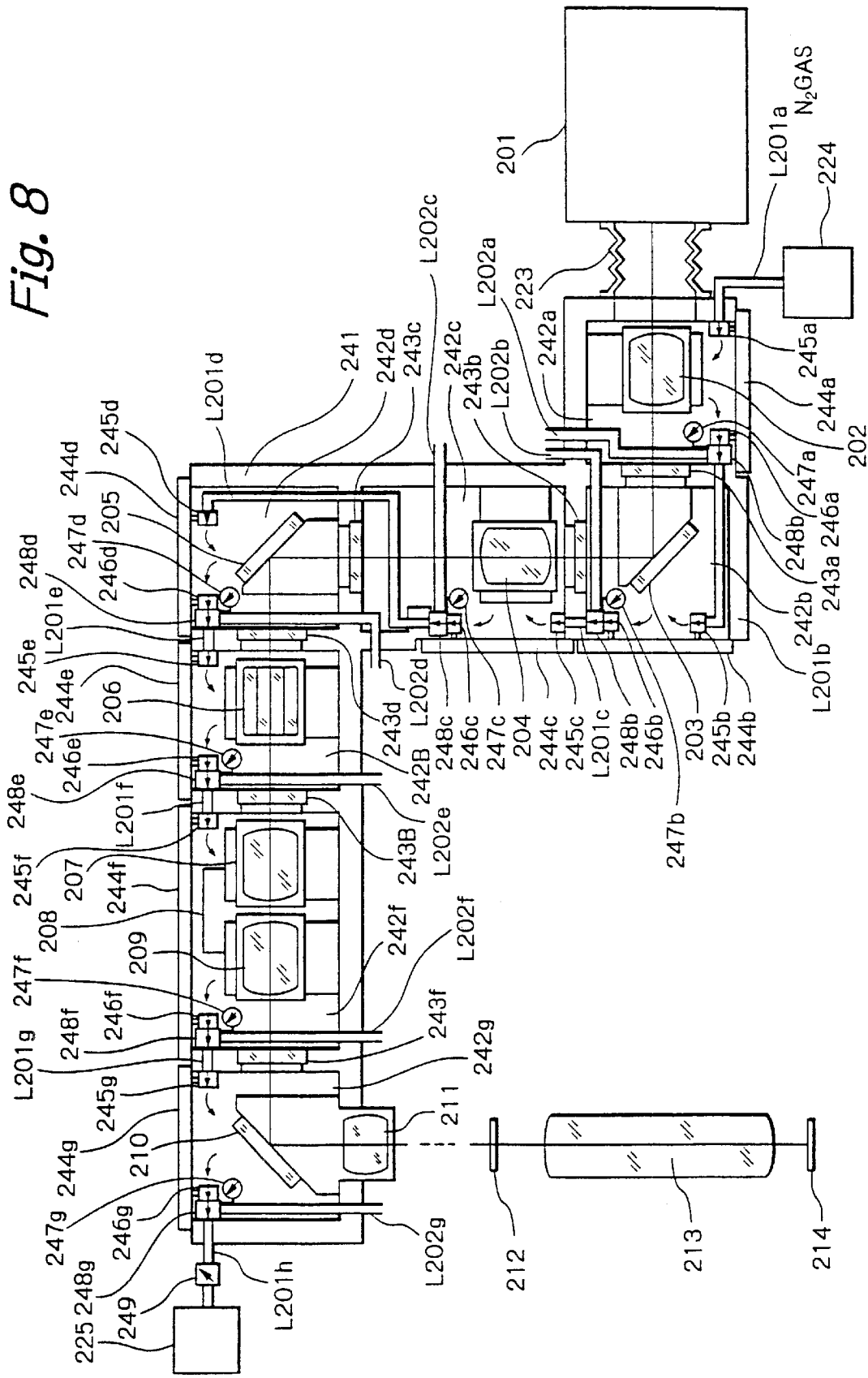
FIG. 8 is a sectional view of an illumination optical system, which is a part of an embodiment of an exposure apparatus according to the present invention.
Figure 15:
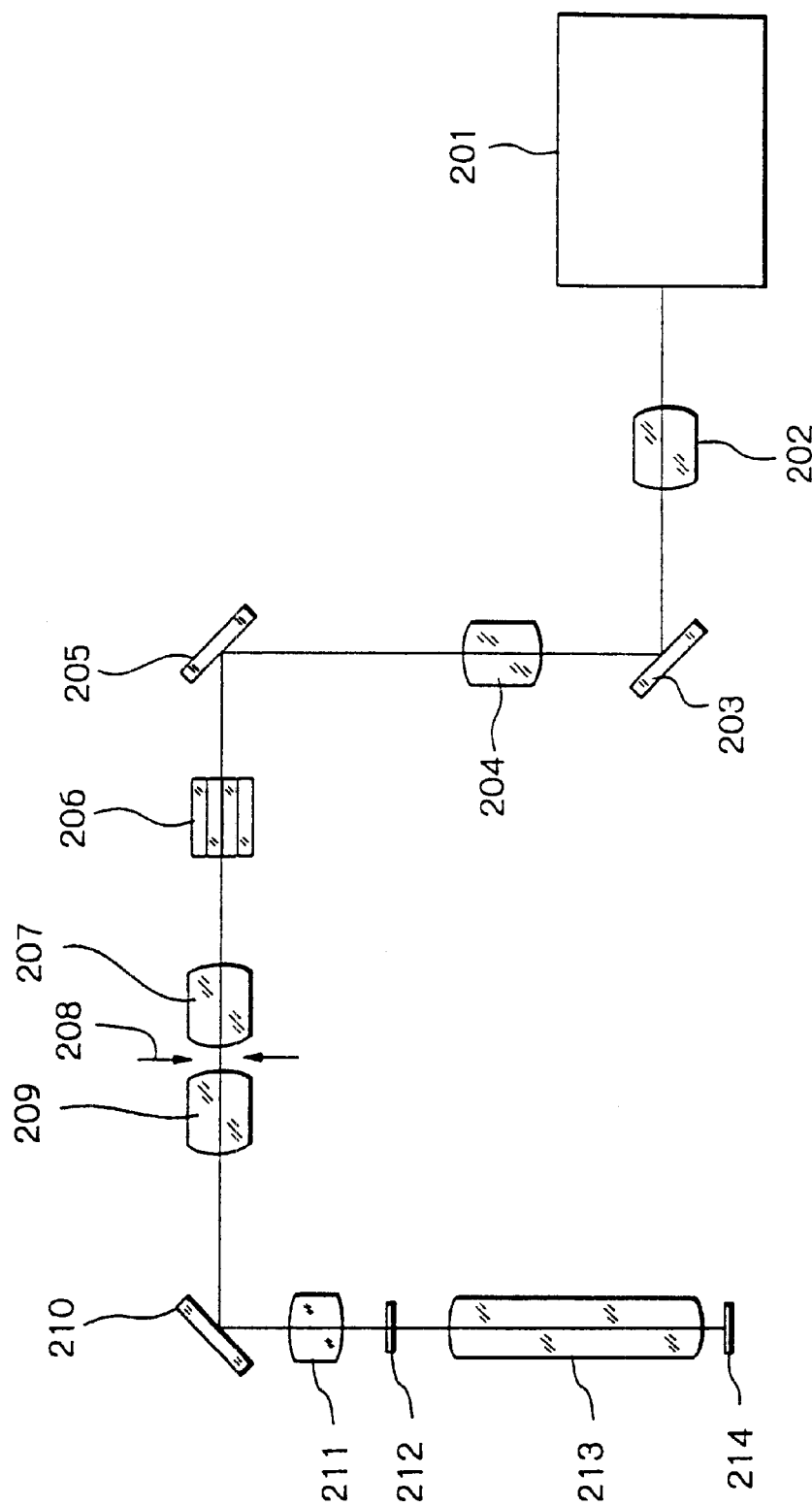
FIG. 15 is a schematic view showing an exposure apparatus.
Figure 16:
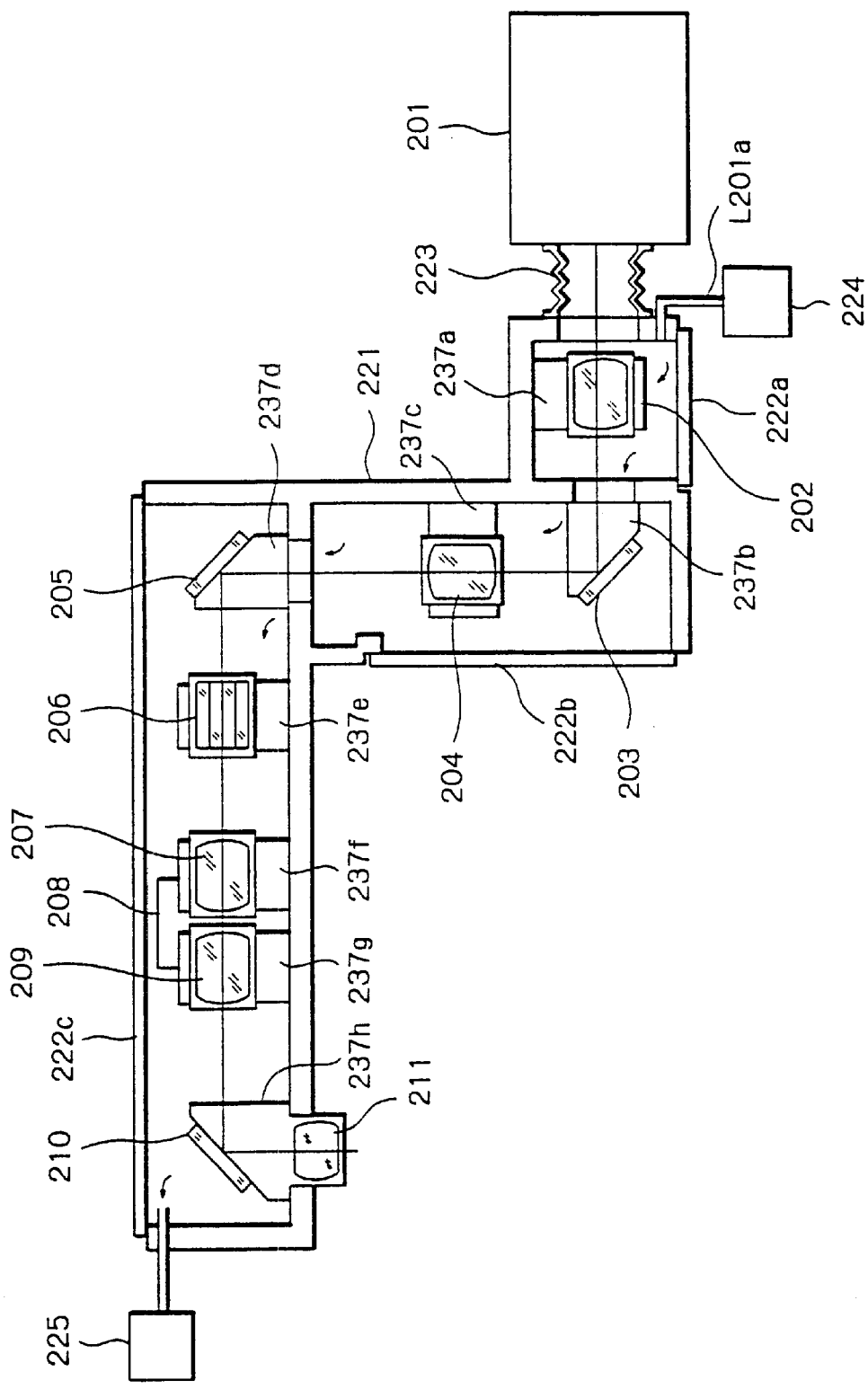
FIG. 16 is a sectional view of an illumination optical system of the exposure apparatus of FIG. 15.
Figure 17:
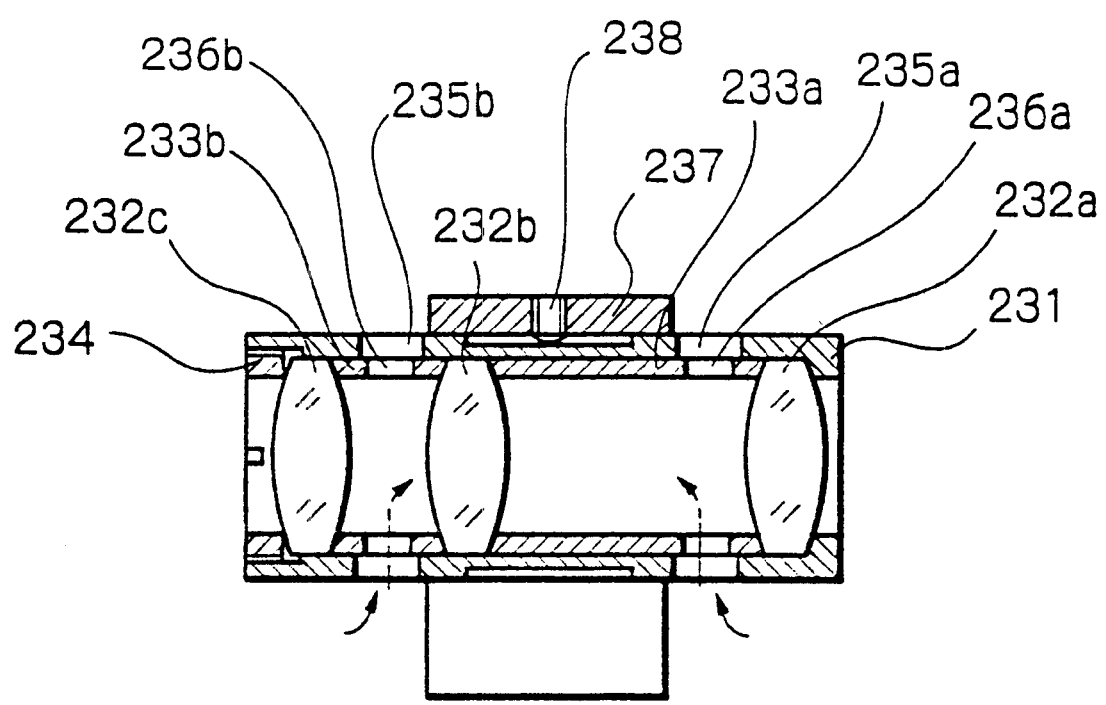
FIG. 17 is a view showing an example of optical parts.

Next, an embodiment of the present invention will be explained with reference to FIGS. 8 to 12. FIG. 8 is a detailed sectional view of an illumination optical system, which is a part of the embodiment of an exposure apparatus according to the present invention. Incidentally, since optical parts constituting the illumination optical system are the same as those of the exposure apparatus shown in FIG. 16, the same elements as those in FIG. 16 are designated by the same reference numerals. Similarly, the reference numerals 212, 213 and 214 denote a reticle, a projection lens and a wafer, respectively, as is similar to FIG. 15. The optical parts are attached within a frame 241 every optical block. The frame 241 are divided into seven chambers 242a–242g, and windows 243a–243f including optical parts are disposed in light path portions formed in partitions between the chambers. Incidentally, when the illumination optical system is designed, features of the windows 243a–243f are taken into consideration. Lids 244a–244g for closing and sealing openings of the chambers are detachably attached to the chambers 242a–242g. Incidentally, although not shown, O-rings or packing are disposed between the frame 241 and the lids 244a–244g to improve sealing ability.

Pipings L201a–L201g serve to supply nitrogen gas from a nitrogen gas supply source 224 to the chambers 242a–242g, and valves 245a–245g are provided in the pipings L201a–L201g. Pipings L202a–L202g serve to discharge the gas in the chambers 242a–242g out of the frame 241, and valves 248a–248g serve to switch or determine whether the gas in the chambers 242a–242g is directed to the adjacent chamber through the pipings L201a–L201g or is discharged out of the frame through the pipings L202a–L202g. Valves 246a–246g are disposed at inlets of the valves 248a–248g. Vent of the valves 248a–248g is switched on the basis of signals from oxygen density sensors 247a–247g for detecting oxygen density in the chambers 242a–242g. A flow rate sensor 249 is disposed in the piping L201h between the chamber 242g and a discharge device 225. The pipings L202a–L202g serve to discharge the gas out of a chamber (not shown) containing the body of the exposure apparatus. Each chamber may-have the nitrogen gas supply source 224 and the discharge device 225.

The valves 245a–245g and 246a–246g are opened when the lids 244a–244g are closed and are closed when the lids 244a–244g are opened. A switch turned ON/OFF in synchronous with opening/closing of the lids 244a–244g may be provided to control the valves, or the valves may be controlled mechanically. Further, as an example, the switching of the valves 248a–248g are performed as follows. When the oxygen density detected by the oxygen density sensors 247a–247g is greater than a predetermined oxygen density value (for example, 1% sufficient to prevent absorption of exposure light and generation of ozone), the gas is directed to the pipings L202a–L202g to reduce the oxygen density, and, when the oxygen density is decreased below the predetermined value, the gas is directed to the pipings L201a–L201g. In FIG. 8, all of the lids 244a–244g are closed showing the fact that the oxygen density in the chambers 242a–242g are less than the predetermined value. Incidentally, the arrows show flow of nitrogen gas.

Now, operations of the above-mentioned valves and oxygen density sensors during the gas replacing operation in the chambers 242a–242g will be explained as the following two examples:

(a) gas replacement during assembling of the illumination optical system; and (b) gas replacement during maintenance.

Figure 9A:
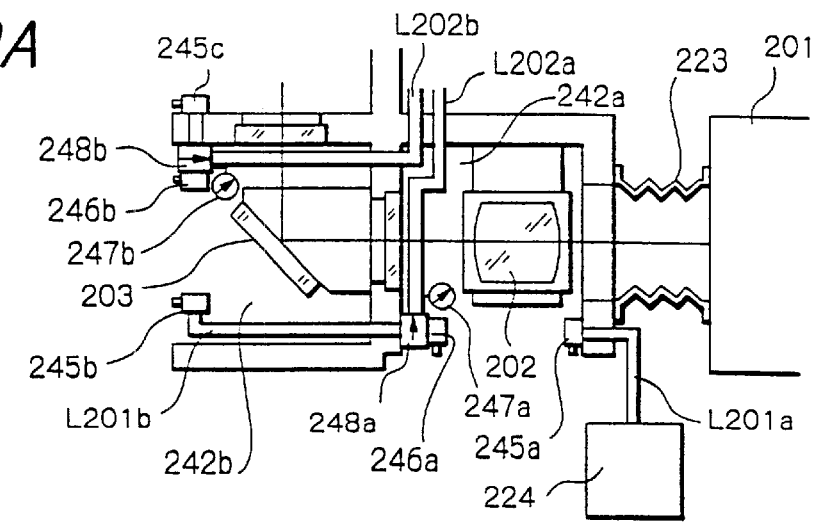
FIG. 9A shows a condition after completion of attachment of optical parts.
Figure 9B:
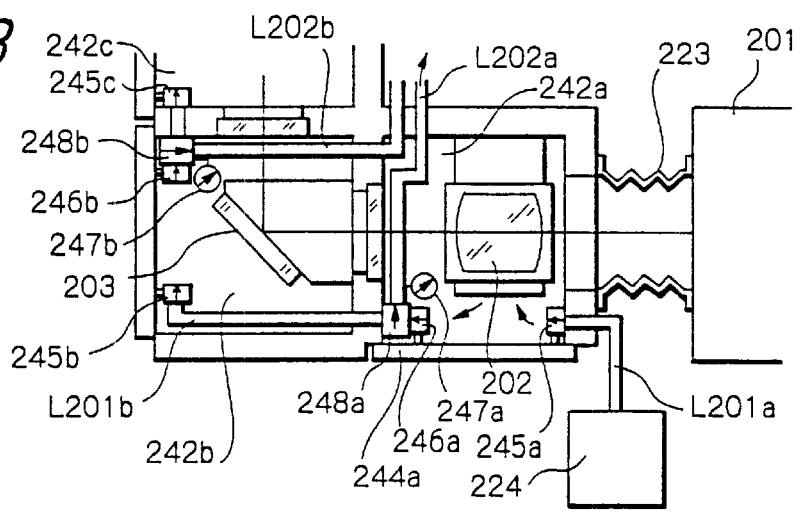
FIG. 9B shows replacement of gas in a chamber 242a, and FIG. 9C shows replacement of gas in a chamber 242b.
Figure 9C:
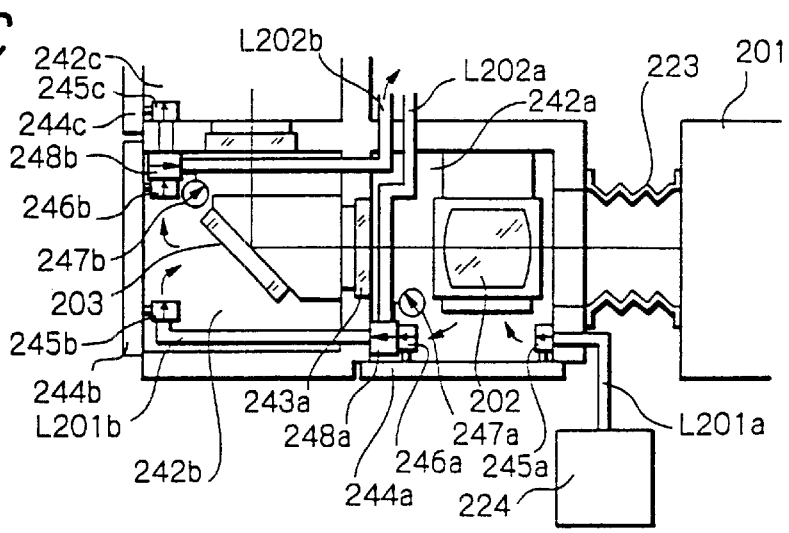
FIG. 9 is a view for explaining replacement of gas during assembling of the illumination optical system, where

(1) During the assembling of the illumination optical system:

FIG. 9A is a sectional view of the chambers 242a and 242b shown in FIG. 8 and shows a condition after the attaching of the optical parts within the frame 241 is completed. In this condition, the lids 244a, 244b of the chambers 242a, 242b are opened. (In FIG. 9A,. the lids 244a, 244b are omitted from illustration). In the condition that the lids 244a, 244b are opened, as mentioned above, the valves 245a, 245b, 246a, 246b are closed. Further, since the oxygen density detected by the oxygen density sensors 247a, 247b exceeds the predetermined value, the vale 248a communicates with the piping L202a and the valve 248b communicates with the piping L202b. In FIG. 9A–9C, the arrows on the valves 245a–245c, 246a, 246b show valve open conditions, and the arrows on the valves 248a, 248b show communication directions of the valves 248a, 248b. The other arrows show flow of the nitrogen gas. Further, the arrows on the oxygen density sensors 247a, 247b show whether the detected oxygen density is higher than the predetermined value or not, and, when higher than the predetermined value, the arrow directs toward a right and upper direction, and, when lower than the predetermined value, the arrow directs toward a left and upper direction.

Then, when the lids 244a–244g of all of the chambers 242a–242g are closed, the valves 245a–245g, 246a–246g are opened, with the result that, as shown in FIG. 9B, the nitrogen gas is supplied to the chamber 242a through the piping L101a. In this case, since the valve 248a is communicated with the piping L202a until the oxygen density in the chamber 242a reaches the predetermined value, the nitrogen gas is supplied to the chamber 242a and the air in the chamber 242a is discharged out of the frame 241 through the piping L202a. As a result, the air in the chamber 242a is gradually replaced by the nitrogen gas, thereby decreasing the oxygen density accordingly.

Thereafter, when the oxygen density in the chamber 242a is decreased below the predetermined value, as shown in FIG. 9C, the communication direction of the valve 248 is changed from the piping L202a to the piping L201b, thereby supplying the nitrogen gas to the chamber 242b. As is similar to the chamber 242a, the gas in the chamber 242b is discharged out of the frame 241 through the piping L202b until the oxygen density is decreased below the predetermined value. When the oxygen density is decreased below the predetermined value, the communication direction of the valve 248b is changed from the piping L202b to the piping L201c, thereby supplying the nitrogen gas to the chamber 242c. Similarly, the air in the chambers 242c–242g shown in FIG. 8 are successively replaced by nitrogen gases.

When the oxygen density in the chamber 242g is greater than the predetermined value, since the valve 248g is communicated with the piping L202g, the flow rate sensor 249 (FIG. 8) does not detect the gas flow. To the contrary, when the oxygen density in the chamber 242g becomes less than the predetermined value, since the communication direction of the valve 248g is changed from the piping L202g to the piping L201h, the gas in the chamber 242g flows into the discharge device 225 and is detected by the flow rate sensor 249. Thus, by utilizing the output of the flow rate sensor 249, the fact that the replacement of gas after assembling can be ascertained.

Figure 10A:
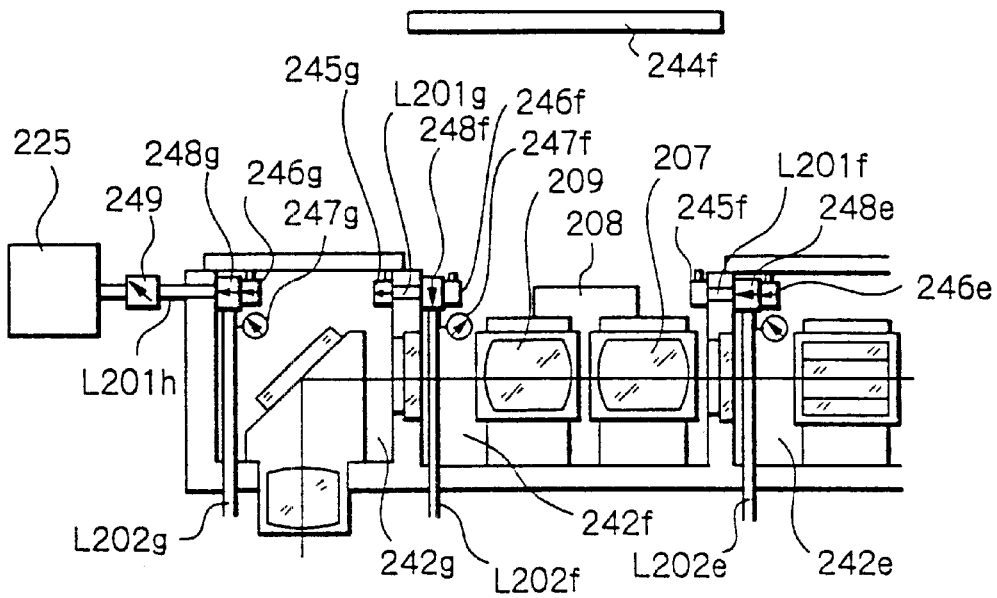
FIG. 10A shows a condition that a lid 244f of a chamber 242f is opened.

(2) During the maintenance:

Next, during the maintenance, for example, the maintenance of a motor for driving the reticle blind 208 will be explained with reference to FIGS. 10A, 10B. Incidentally, in FIGS. 10A, 10B the chamber 242f and adjacent chambers are shown, and other chambers are omitted from illustration. .First of all, as shown in FIG. 10A, when the lid 244f of the chamber 242f in which the reticle blind 208 is secured is opened, the valves 245f, 246f are closed. In this case, since the chamber 242f is communicated with the atmosphere, the oxygen density becomes greater than the predetermined value, with the result that the valve 248f is communicated with the piping L202f. Consequently, the communication between the chambers 242f and 242e and the communication between the chambers 242f and 242g are blocked, with the result that the chambers other than the chamber 242f remain to be filled with the nitrogen gas. However, since the gas in the chamber 242g is discharged by the discharge device 225, the pressure in the chamber 242g is held to a value less than the atmospheric pressure. Thus, until the pressure in the chamber 242g becomes substantially constant, the flow rate detected by the flow rate sensor 249 is very small, and, after the pressure becomes substantially constant, the flow rate sensor 249 does not detect the flow rate. Incidentally, the arrow on the flow rate sensor 249 indicates the magnitude of the flow rate. Particularly, in the condition shown in FIG. 8, the arrow direction toward a right and upper direction indicates the fact that the gas is flowing in a steady-state condition, and, as shown in FIGS. 10A, 10B, when the chamber 242f is subjected to maintenance and the gas is almost not flowing, such a condition is indicated by the arrow directing toward a left and upper direction.

Figure 10B:
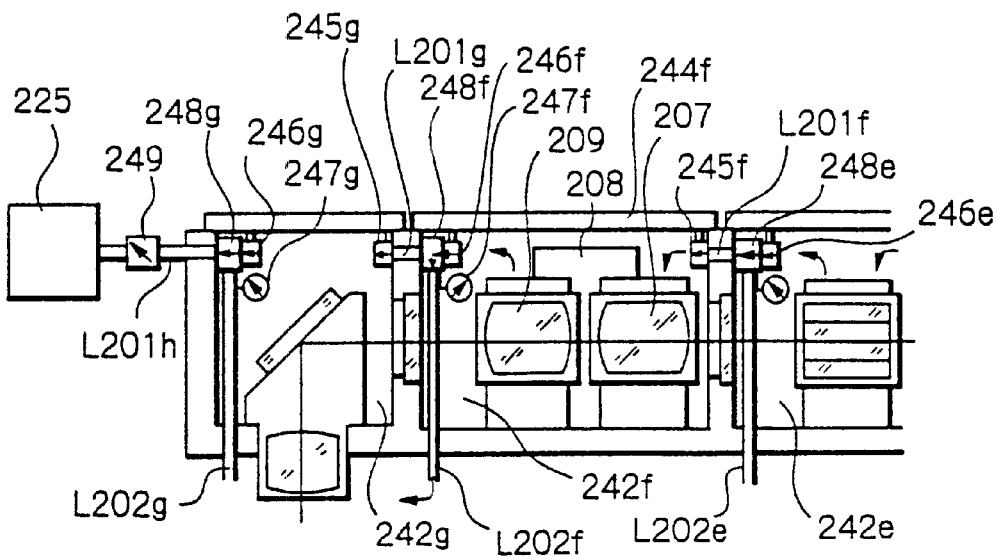
FIG. 10B shows replacement of gas in the chamber 242f after the lid 244f is closed.

After the maintenance is finished, when the lid 244f is closed as shown in FIG. 10B, the valves 245f, 246f are opened, with the result that the nitrogen gas flows from the chamber 242e to the chamber 242f. However, immediately after the lid 244f is closed, since the oxygen density in the chamber 242f is greater than the predetermined value, the valve 248f remains to be communicated with the piping L202f, with the result that the gas in the chamber 242f is discharged out of the frame 241 through the piping L202f. Thereafter, when the oxygen density in the chamber 242f becomes less than the predetermined value, the communication direction of the valve 248f is changed to the piping L201g, with the result that the nitrogen gas in the chamber 242f flows into the chamber 242g and is discharged by the discharge device 225.

When the nitrogen gas is discharged by the discharge device 225, since the gas flow is detected by the flow rate sensor 249, by utilizing the output of the flow rate sensor 249, the fact that the maintenance is finished can be recognized. Further, when the output is used for interlock of the ArF excimer laser light source 201, if the replacement of nitrogen is insufficient during the maintenance or after the maintenance, a control circuit of the exposure apparatus can control to stop the emission of the laser beam. Further, even when supply from a nitrogen gas supply source 224 is stopped or the flow rate is decreased, such a condition can be detected, and, in such a condition, the emission of the laser beam may be stopped.

The above-mentioned embodiment gives the following advantages.

(1) Since the frame 241 of the illumination system is divided into the chambers at every optical block, during the maintenance, only the chamber of the optical block requiring the maintenance may be communicated with the atmosphere, with the result that leakage of gas during the maintenance can be reduced and the time period required for replacement of nitrogen gas after the maintenance can be shortened.

(2) By providing the valves 245a–245g, 246a–246g opened and closed in synchronous with the closing/opening of the lids 244a–244g and the valves 248a–248g for switching the communication direction, depending on the oxygen density in the chambers 242a–242g, ① supply and stop of the nitrogen gas into the chambers 242a–242g and ② the replacement of gas in the chambers 242a–242g can automatically be effected, depending on the opening/closing of the lids 244a–244g. Thus, the maintenance can be facilitated and the time period required for the maintenance can be shortened.

(3) By monitoring the flow rate of discharged gas by using the flow rate sensor 249, the completion of the maintenance can automatically be judged and the output of the sensor can be used in the interlock of the ArF excimer laser light source 201. Thus, erroneous laser illumination before replacement of nitrogen gas can be prevented.

In place of the signal of the flow rate sensor 249, signals from the oxygen density sensors 247a–247g may be used for the aforementioned interlock. That is to say, if any one of the oxygen density sensors 247a–247g detects the oxygen density greater than the predetermined value, it is judged as under maintenance, and, if all of the sensors detect the oxygen density less than the predetermined value, it is judged as completion of maintenance. However, in such a case, unlike to usage of the flow rate sensor 249, the change in flow rate of the nitrogen gas cannot be detected.

(Alteration)

Figure 11:
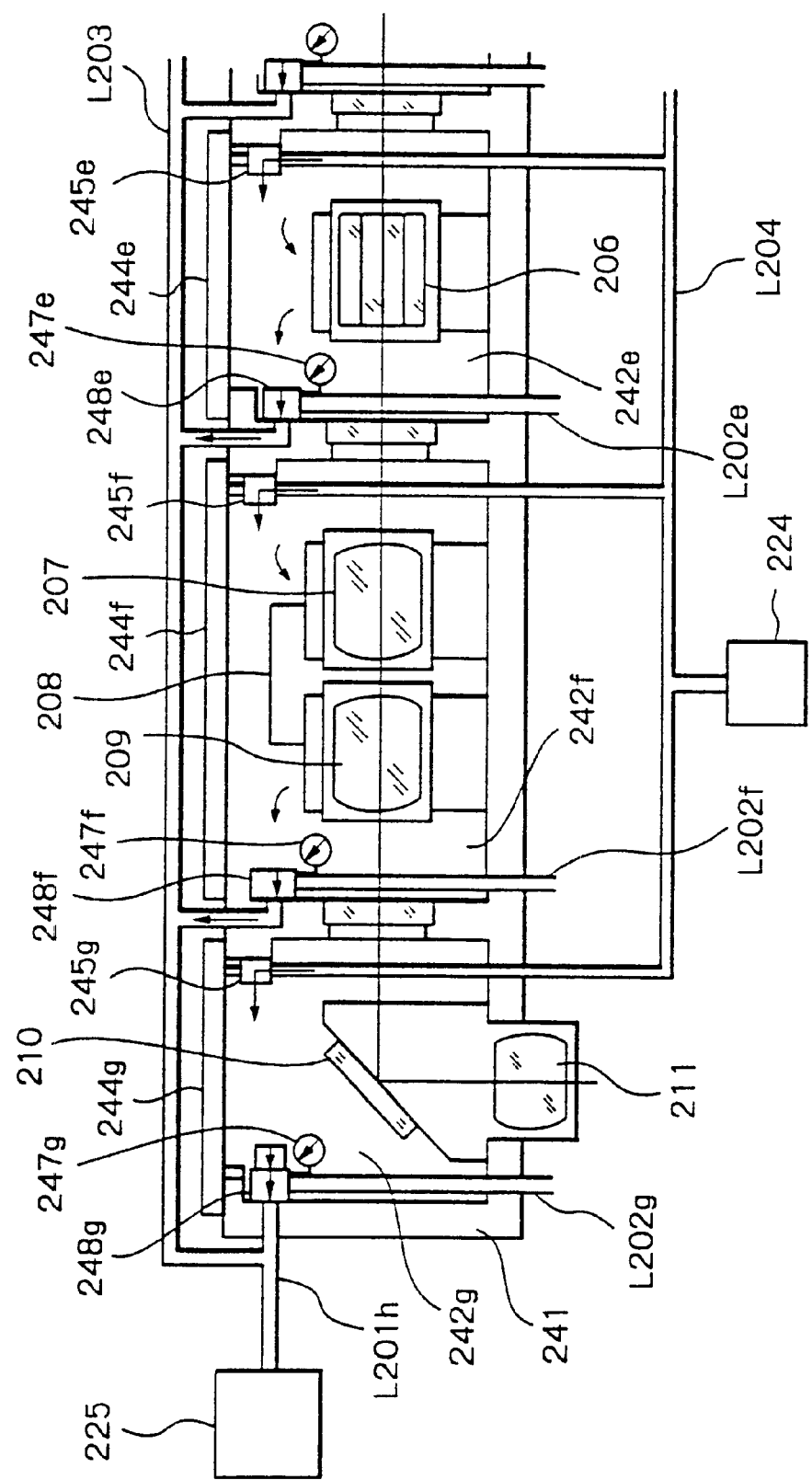
FIG. 11 is a view for explaining an alteration.

FIG. 11 shows an alteration of the apparatus shown in FIG. 8. In this alteration, supply of nitrogen gas into the chambers is effected in parallel. Incidentally, FIG. 11 only shows a part of the apparatus (parts associated with the chambers 242e, 242f, 242g), and the same elements as those in FIG. 8 are designated by the same reference numerals, and differences will be mainly described. Nitrogen gas is supplied from the nitrogen gas supply device 224 to the chambers 242e, 242f, 242g in which optical parts are disposed through a piping L204. On the other hand, the gas in the chambers 242e, 242f, 242g is discharged by the discharge device 225 through a piping L203. That is to say, in the apparatus according to the alteration, the chambers for which the lids 244e–244g are closed are always subjected to nitrogen gas purge.

Figure 12A:
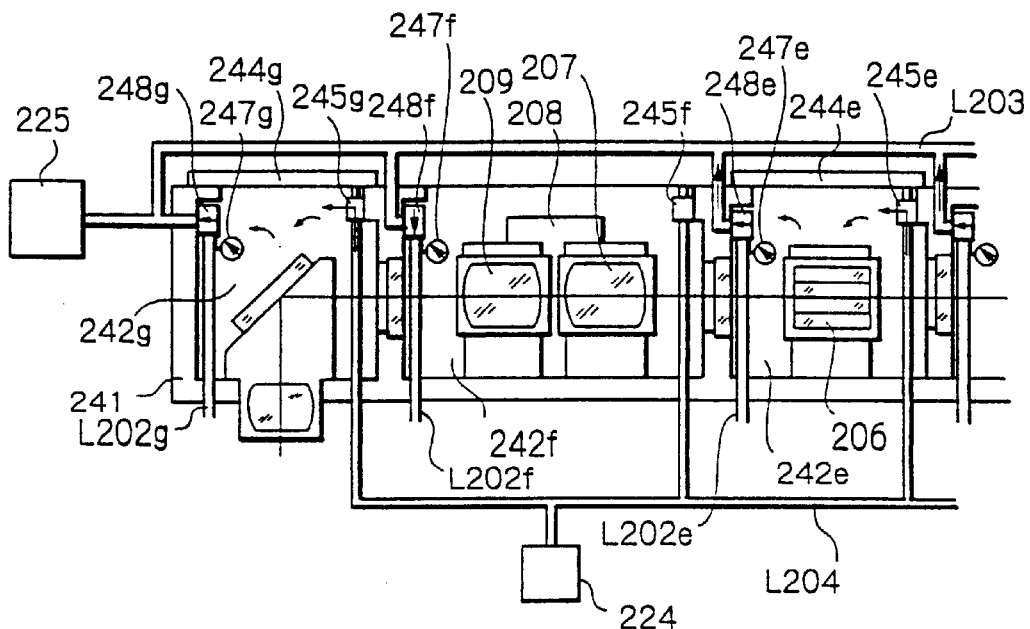
FIG. 12A shows a condition that a lid 244f of a chamber 242f is opened.
Figure 12B:
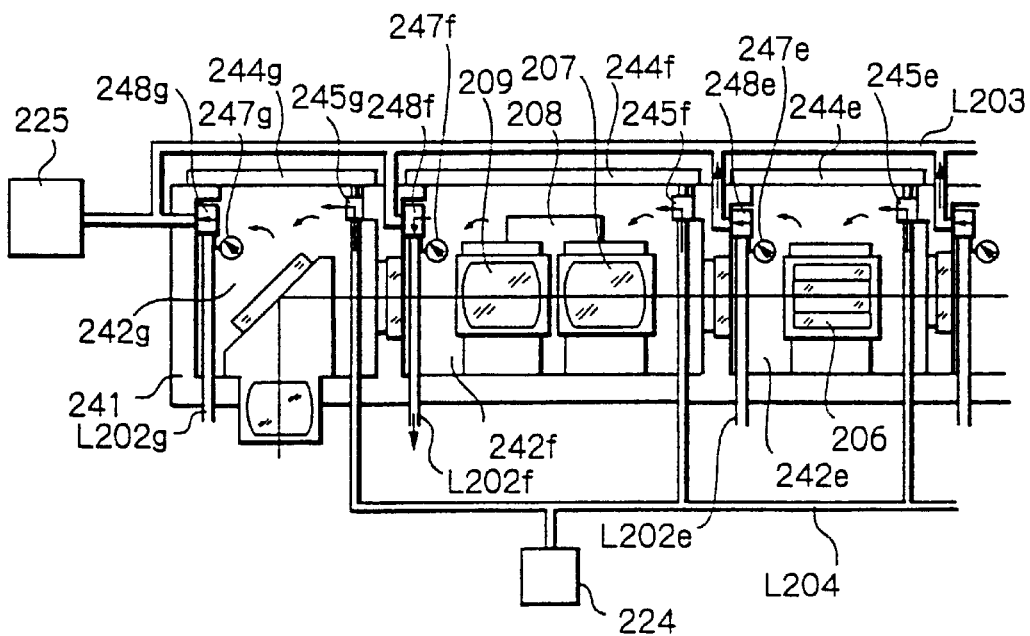
FIG. 12B shows replacement of gas in the chamber 242f after the lid 244f is closed.

Next, FIGS. 12A and 12B explain an operation of various valves when the maintenance of the reticle blind 208 is performed. As shown in FIG. 12A, when the lid 244f is opened to communicate the chamber 242f with the atmosphere, the valve 245f is opened and the oxygen density in the chamber 242f becomes greater than the predetermined value, with the result that the communication direction of the valve 248f is changed from the piping L203 to the piping L202f. In this case, the nitrogen gas purge of the other chambers 242e, 242g is still continued. After the maintenance is completed, when the lid 244f is closed as shown in FIG. 12B, the valve 245f is opened to supply the nitrogen gas into the chamber 242f. However, immediately after the lid 244f is closed, since the oxygen density in the chamber 242f is still greater than the predetermined value, the valve 248f is communicated with the piping L202f, with the result that the gas in the chamber 242f is discharged through the piping L202f.

Thereafter, as the replacement of gas in the chamber 242f continues, when the oxygen density becomes less than the predetermined value, the communication direction of the valve 248f is changed from the piping L202f to the piping L203, with the result that the gas in the chamber 242f is discharged by the discharge device 225. In the apparatus according to this alteration, the completion of the maintenance is judged on the basis of the signals from the oxygen density sensors 247e–247g. That is to say, if one of the oxygen density sensors 247a–247g detects the oxygen density greater than the predetermined value, it is judged as under maintenance, and, if all of the sensors detect the oxygen density less than the predetermined value, it is judged as completion of maintenance.

In the apparatus shown in FIG. 8, as shown in FIG. 10A, when the oxygen density in the chamber 242f is greater than the predetermined value to communicate the valve 248f with the piping L202f, the chamber 242g at a downstream side of the chamber 242f regarding gas purge may have pressure smaller than the atmospheric pressure as mentioned above. In consideration of this, it is required that the chambers are designed to resist against the external atmospheric pressure. However, in the apparatus according to the alteration, since the chambers having the closed lids are always subjected to the gas purge, great strength such as that in the apparatus of FIG. 8 is not required.

Figure 13:
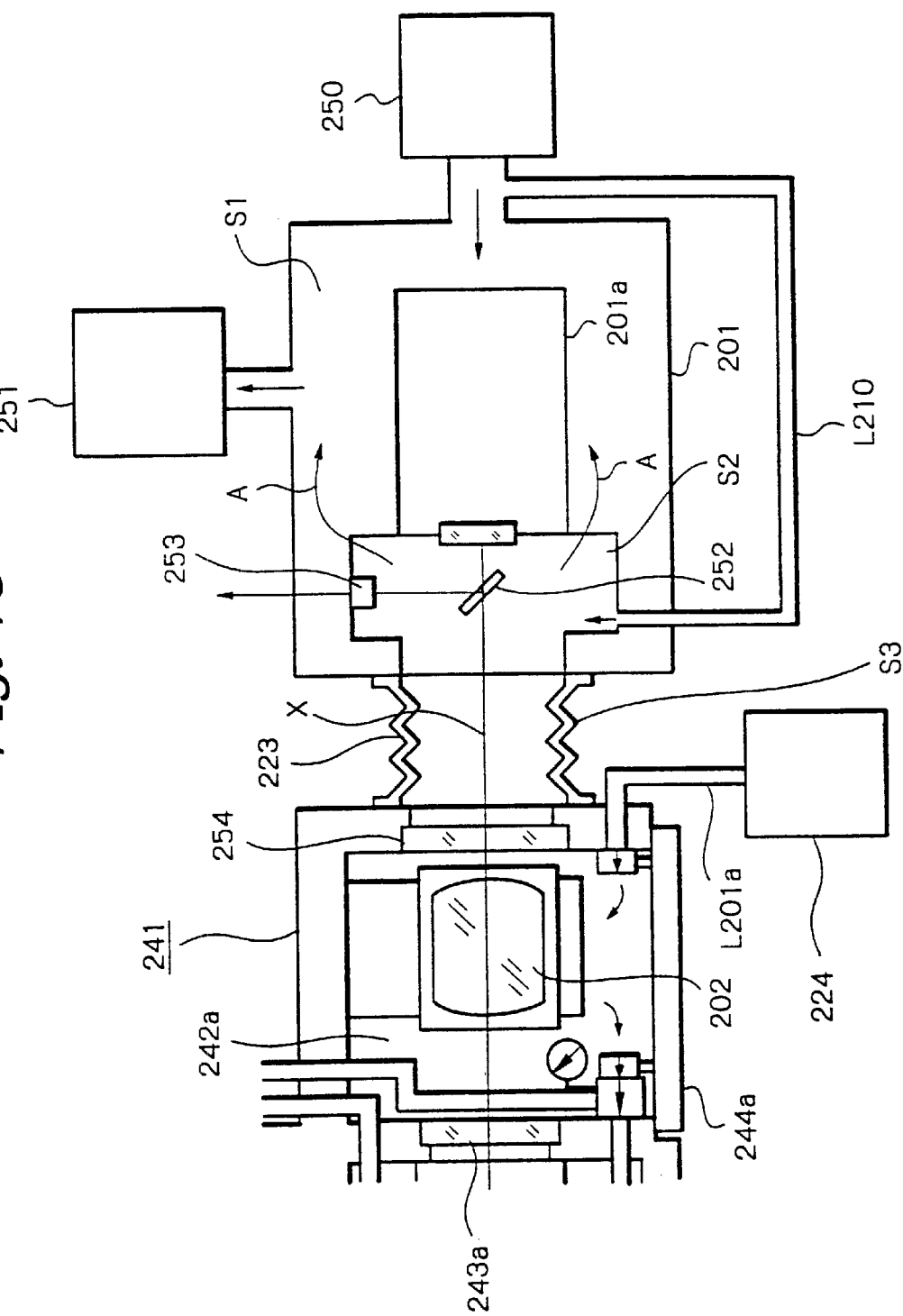
FIG. 13 is a view showing another embodiment of an exposure apparatus.

FIG. 13 shows another embodiment of an exposure apparatus according to the present invention and shows a chamber 242a at an ArF excimer laser light source side of an illumination optical system and the laser light source 201 in detail. In general, two spaces S1, S2 are formed in the laser-light source 201, and a laser generating portion 201a is housed in the space S1. A gas supply device 250 and a discharge device 251 are connected to the space S1, and gas (generally, inert gas) supplied from the gas supply device 250 to the space S1 is circulated within the space S1 and is discharged by the discharge device 251. On the other hand, as shown in FIG. 13, the space S2 is communicated with a space S3 defined by a bellows 223, and gas is supplied to the space S2 from the gas supply source 250 through a piping L210. By detecting reflection light from a mirror 252 by means of a detector 253, intensity of the laser beam is detected.

In general, pressure in the space S1 is selected to be smaller than pressure in the space S2 and the atmospheric pressure. Thus, while flow of gas from the space S2 to the space S1 (as shown by an arrow A) may be generated and the air may flow into the space S1 from the atmosphere, the gas does not leak from the space S1 to the atmosphere. The reason why the laser light source 201 has the above-mentioned construction is that, even if ArF gas used in the laser generating portion 201a leaks, a room in which the exposure apparatus is installed is prevented from being contaminated by the ArF gas. For example, if the ArF gas leaks into the space S1, the ArF gas does not leak from the space S1 toward the atmosphere but is discharged by the discharge device 251. On the other hand, if the ArF gas leaks into the space S2, since the ArF gas flows from the space S2 into the space S1 and then is discharged by the discharge device 251, the ArF gas does not leak toward the atmosphere.

In the aforementioned embodiment, while an example that the chamber 242a in which the beam shaping lens 202 is housed is communicated with the bellows 223 was explained, in this embodiment, there is provided a window 254 (made of quartz or fluorite) as a partition between the chamber 242a and the space S3 defined by the bellows 223. With this arrangement, the space S2 of the laser light source 201 is isolated from the chamber 242a by the window 254 to give the following advantages, in addition to the advantages of the aforementioned embodiment:

① The replacement gas in the frame 241 in which the optical parts are housed is prevented from flowing toward the laser light source 201. As mentioned above, since the pressure in the frame 241 is greater than the pressure in the space S1 of the laser light source 201, if there is no window 254 in FIG. 13, the gas flows from the frame 241 through the spaces S3, S2 to the space S1; however, in this embodiment, such gas flow can be prevented by the window 254. As a result, the replacement gas in the frame 241 does not flow into the replacement area (spaces S1 and S2) of the laser light source 201, thereby protecting the replacement area of the laser light source 201.

② During the maintenance of the beam shaping lens 202, g when the chamber 242a is opened to the atmosphere, the space S2 of the laser light source 201 can be prevented from being exposed to the atmosphere.

③ Even if the ArF gas flows into the bellows 223 due to an accident, since the ArF gas does not flow from the bellows 223 into the frame 241, the optical parts within the frame can be protected.

Figure 14:
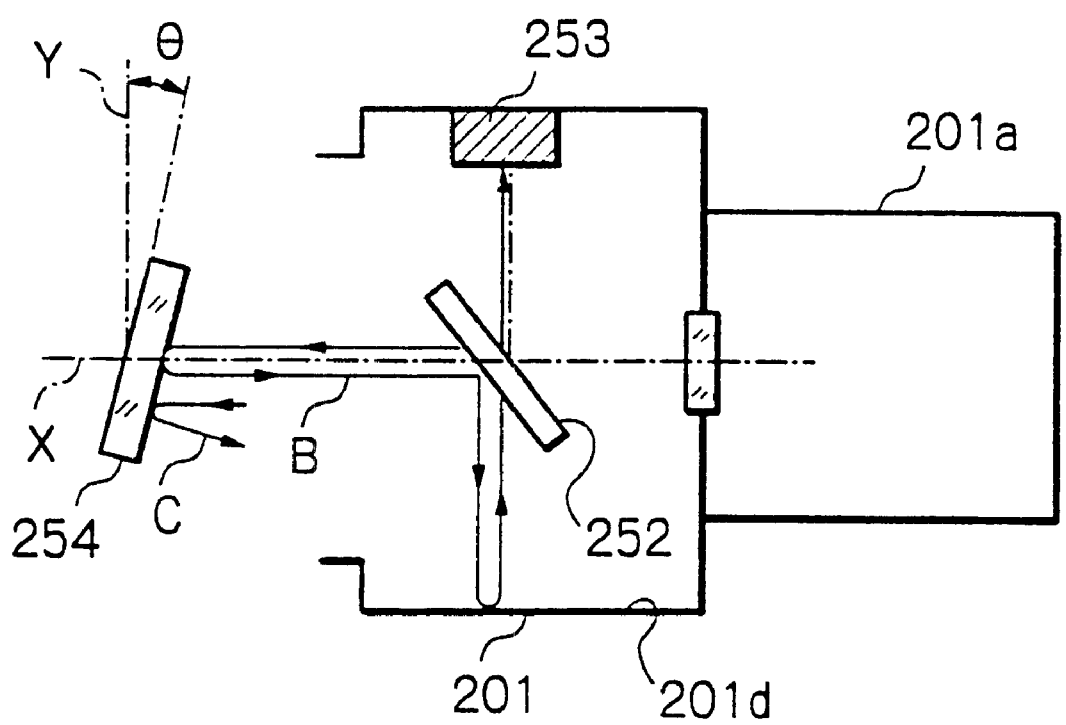
FIG. 14 is a view for explaining a case where a window member 254 is inclined.

FIG. 14 shows an alteration of the apparatus of FIG. 13. In this alteration, a face of the window 254 is inclined by an angle of θ with respect to an axis Y perpendicular to an optical axis X. The other arrangements are the same as those of the apparatus shown in FIG. 13. In FIG. 14, "B" indicates a light path of a laser beam reflected by the window 254 if the face of the window 254 is arranged perpendicular to the optical axis X. The reflected laser beam B is reflected downwardly by a half mirror 252 and is reflected by an inner surface 201d of the laser light source 201 and then is passed through the half mirror 252 to be incident on a detector 253. Thus, this arrangement affects a bad influence upon the measurement of intensity of laser beam.

To the contrary, when the face of the window 254 is inclined by the angle of θ with respect to the axis Y in the apparatus in FIG. 14, since the laser beam is reflected rightwardly and downwardly (as a reflected beam C), the reflected beam does not enter into the detector 253, unlike to the reflected beam B. The angle θ is selected so that the reflected beam does not enter into the detector 253 and is preferably about 10 degrees. Incidentally, the window 254 may also act as an optical part of the illumination optical system. In the illustrated embodiment, while an example that the frame 241 is directly connected to the chamber 242a at the laser light source 201 side via the bellows 223 was explained, a transmission optical system may be disposed between the frame 241 and the chamber 242a at the laser light source 201 side.

The transmission optical system is constituted by optical elements such as a mirror, a prism and a lens disposed on an optical-axis, and a cover for sealing these optical elements. In the illustrated embodiment, when such a transmission optical system is provided, one end of the cover of the transmission optical system may be connected to the chamber 242a at the laser light source 201 side, and the other end of the cover of the transmission optical system may be connected to the bellows 223.

Further, in the illustrated embodiment, while an example that the partition window 254 is disposed between then chamber 242a at the laser light source 201 side and the space S3 defined by the bellows 223 was explained, the partition window 254 may be disposed between the space S2 of the laser light source 201 and the space S3 defined by the bellows 223. Further, such windows 254 may be disposed between the chamber 242a of the frame 241 and the space S3 defined by the bellows 223, and between the space S2 of the laser light source 201 and the space S3 defined by the bellows 223.

The window 254 may be constituted by one of the optical elements of the transmission optical system. In addition, since the window 254 may be contaminated (or fogged) by illumination of exposure light, it is desirable that the window can be replaced.

In the illustrated embodiments, while an example that the nitrogen gas is used as gas purged in the frame 241 was explained, other inert gas such as helium, neon, argon, krypton, xenon, radon or the like may be used. Further, while the present invention was applied to the exposure apparatus in which the problem regarding the light absorption due to presence of oxygen molecules arises by using the ArF excimer laser light source, the present invention can also be applied to exposure apparatuses in which a high harmonic wave of Yag laser, a KrF excimer laser, an i-ray mercury lamp or a g-ray mercury lamp is used as a light source and inert gas purge is effected to prevent fog of optical parts. When an $F_2$ laser (having a wavelength of 157 nm) may be used, helium gas may be used. When a wave length of light is less than 190 nm, it is preferable that inert gas such as helium, neon, argon or krypton may be used. Furthermore, when the KrF excimer laser is used, chemically clean dry air (air from which substances for causing fog of lenses (for example, ammonium ions tending to float within a clean room) are removed) may be used as gas purged in the chambers.

Further, in the illustrated embodiments, the sentence "optical parts are housed in chambers" means to include "group of optical parts are disposed at boundaries between chambers". That is to say, in place of the windows provided in the light paths in the partitions between the chambers, the optical parts may be arranged.

Regarding a relation between the embodiments as mentioned above and elements in claims, sets of (valve 248a, passage L202a)–(valve 248g, passage L202g) correspond to a discharge switching means; the gas supply device 224, valves 248a–248g and pipings L202a–L202g corresponds to a gas replacing means; the piping L201h corresponds to a discharge passage in claim 32; the piping L203 corresponds to a discharge passage in claim 35; the gas supply device 224 and piping L201a correspond to a gas supply means in claim 32; the gas supply device 224 and piping L204 correspond to a gas supply means in claim 35; and, a set of a mirror 210 and a main condenser lens 211, a set of first relay lens 207, reticle blind 208 and a second relay lens 209, a beam shaping lens 202, a mirror 203, a beam expander lens 204, a mirror 205 and a fly-eye lens 206 constitute seven optical parts.

Further, in the illustrated embodiments, as the exposure illumination light, ultraviolet light having a wavelength of 100 nm or more (for example, far ultraviolet (DUV) light such as g-ray, i-ray or KrF excimer laser, or, vacuum ultraviolet (VUV) light such as ArF excimer laser or $F_2$ laser (having a wavelength of 157 nm)) may be used. In a scan type exposure apparatuses having the $F_2$ laser as a light source, as is similar to the aforementioned embodiments, a reflection/refraction optical system is used as a projection optical system, and refraction optical members (lens elements) used in the illumination optical system and the projection optical system are all made of fluorite, and the air in the $F_2$ laser light source, illumination optical system and the projection optical system is replaced by helium gas, and a space between the illumination optical system and the projection optical system as well as a space between the projection optical system and the wafer are filled with helium gas. Further, in the exposure apparatuses using the $F_2$ laser, a reticle made of fluorite, synthetic quartz obtained by doping fluorine, magnesium fluoride or crystal is used. Incidentally, the refraction members used in the projection optical system may be made of not only fluorite but also at least one of synthetic quartz obtained by doping fluorine and magnesium fluoride and crystal.

In place of the excimer laser, for example, a high harmonic wave of a solid laser such as YAG laser having oscillation spectrum including a wavelength of either of 248 nm, 193 nm or 157 nm may be used.

Further, an infrared area emitted from a DFB semiconductor laser or a fiber laser, or a visible band single wavelength laser may be amplified by, for example, a fiber amplifier doped by erbium (or both erbium and ytterbium) and then be wavelength-converted into ultraviolet light by using a non-linear optical crystal to obtain a high harmonic wave which can be in turn used in place of the excimer laser.

For example, when the oscillation wavelength of the single wavelength laser is within a range of 1.51 $\mu$m–1.59 $\mu$m, an eight-time high harmonic wave generating a wavelength of 189–199 nm or a ten-time high harmonic wave generating a wavelength of 151–159 nm is outputted. Particularly when the oscillation wavelength is within a range of 1.544 $\mu$m–1.553 $\mu$m, an eight-time high harmonic wave generating a wavelength of 193–194 nm (i.e., ultraviolet light having a wavelength substantially the same as that of the ArF excimer laser) can be obtained. Further, when the oscillation wavelength is within a range of 1.57 $\mu$m–1.58 $\mu$m, a ten-time high harmonic wave generating a wavelength of 157–158 nm (i.e., ultraviolet light having a wavelength substantially the same as that of the $F_2$ laser) can be obtained.

Further, when the oscillation wavelength is within a range of 1.03 $\mu$m–1.12 $\mu$m, a seven-time high harmonic wave generating a wavelength of 147–160 nm is outputted, and, particularly when the oscillation wavelength is within a range of 1.099 μm–1.106 μm, a seven-time high harmonic wave generating a wavelength of 157–158 nm (i.e., ultraviolet light having a wavelength substantially the same as that of the $F_2$ laser) can be obtained. Incidentally, an ytterbium dope fiber laser is used as the single wavelength oscillation laser.

Of course, in the above embodiment, the wavelength of the exposure illumination light is not limited to 100 nm or more. For example, in order to expose a pattern having a dimension of 70 nm or less, SOR or plasma laser is used as a light source to generate EUV (Extreme Ultra Violet) light having a soft X-ray area (for example, area having a wavelength of 5–15 nm), and EUV exposure apparatuses using an all reflection demagnification optical system and a reflection type mask which are designed on the basis of the exposure wavelength (for example, 13.5 nm) have been developed. In such apparatuses, since it is considered to provide an arrangement in which the mask and a wafer are simultaneously scanned by using an arc illumination, the present invention can also be applied to such apparatuses.

Regarding the projection optical system, not only a demagnification system but also an equal-magnification system or an enlargement (or magnification) system (for example, a liquid crystal display manufacturing exposure apparatus) may be used.

Further, the present invention can also be applied to not only the exposure apparatus used for manufacturing the semi-conductor element but also an exposure apparatus used for manufacturing a display including a liquid crystal display element and adapted to transfer a device pattern onto a glass plate, an exposure apparatus used for manufacturing a thin film magnetic head and adapted to transfer a device pattern onto a ceramic wafer and an exposure apparatus used for manufacturing an imaging element (such as CCD). Further, the present invention can also be applied to an exposure apparatus for transferring a circuit pattern onto a glass substrate or a silicon wafer in order to manufacture a reticle or a mask.

By incorporating the illumination optical system and the projection optical system which include a plurality of lenses into the exposure apparatus and by effecting optical adjustment and by attaching a reticle stage and a wafer stage which include a number of mechanical parts to the exposure apparatus and by effecting wiring and piping and further by effecting entire adjustment (electrical adjustment and check of performance), the exposure apparatus according to the illustrated embodiments can be manufactured. Incidentally, it is desirable that the exposure apparatus is manufactured in a clean room in which a temperature and cleanness are controlled.

The semi-conductor device is manufactured through a step for designing function and performance of the device, a step for manufacturing a reticle on the basis of the designing step, a step for manufacturing a wafer from silicon material, a step for exposing a pattern of the reticle onto the wafer by using the exposure apparatus according to the illustrated embodiment, a step for assembling the device (including dicing process, bonding process and packaging process), and a checking step. As mentioned above, the present invention is not limited to the above-mentioned embodiments, and, of course, various alterations and modifications can be effected without departing from the scope of the invention.

As mentioned above, according to the present invention, since the optical parts are housed in the independent chambers, for example, when the maintenance is performed, only the chamber requiring the maintenance may be opened to the atmosphere, thereby reducing the loss of the inert gas and reducing the rise-time of the maintenance.

According to the invention in claim 32, since supply and stop of the inert gas with respect the chambers are automatically effected in synchronous with the opening/closing of the lids, the maintenance operation can be simplified.

According to the invention in claim 33, the replacement of gas only in the chamber opened to the atmosphere by opening the lid can be effected automatically and securely.

According to the invention in claim 34, since the light source of the exposure apparatus is turned OFF until the flow rate sensor detects the flow rate when the oxygen density in the chamber reaches the value less than the predetermined value after the lid of the chamber is closed, during the maintenance, if the replacement of gas in the chamber is insufficient, the light source is prevented from being turned ON erroneously.

According to the invention in claim 35, since supply and stop of the inert gas with respect the chambers and replacement of gas are automatically effected in synchronous with the opening/closing of the lids, the maintenance operation can be simplified.

In the invention according to claims 37 and 38, since the air spaces of the chambers and the frame to which the light source is connected are isolated from the air space of the light source side by the window member, if the frame or the chamber is contaminated by the atmosphere, the influence of the contamination does not affect upon the light source side, and, if the light source gas leaks in the light source side, the influence of gas leakage does not affect upon the frame and the chambers side.

Further, as is in claim 39, by inclining the face of the window member with respect to the plane perpendicular to the optical axis, a bad influence of the light reflected by the window member can be prevented from affecting upon the light source (for example, a bad influence upon the light amount measurement of the light amount detector provided in association with the light source).

What is claimed is:

1. A projection exposure apparatus comprising:
    an illumination optical system which applies light of a specific wavelength to a mask formed with a pattern;
    a projection optical system which projects a pattern image of said illuminated mask onto a substrate;
    hermetically sealing device which shuts off from an atmosphere an optical path extending from a light source of said illumination optical system to an end of said projection optical system which is closer to said mask; and
    at least one partition device which partitions a space in said hermetically sealing device to form a plurality of hermetic blocks which are to be filled with an inert gas, said at least one partition device being selectively movable between a first position where, when projection exposure is carried out, said partition device allows passage of exposure light and does not shut off said hermetic blocks from each other, and a second position where said partition device shuts off said hermetic blocks from each other when projection exposure is not carried out.

2. A projection exposure apparatus according to claim 1, wherein said partition device has a partition wall which is approximately perpendicular to said optical path and which has an opening that allows passage of exposure light and communication of the inert gas between a pair of adjacent hermetic blocks, and closing member which hermetically closes said opening by reciprocally moving relative to said partition wall as occasion demands.

3. A projection exposure apparatus according to claim 1, wherein said hermetically sealing device has measuring system which measures an irradiation dose of illuminating light from the light source of said illumination optical system, and light intercepting member which intercepts illuminating light from said light source on the basis of a result of measurement by said measuring system.

4. A projection exposure apparatus according to claim 3, wherein one of said partition device that is the closest to said light source also serves as said light intercepting member.

5. A projection exposure apparatus according to claim 1, wherein said hermetically sealing device further has evacuation system which evacuates each of the hermetic blocks partitioned by said partition device, and gas supply system which supplies an inert gas to each of said hermetic blocks.

6. A projection exposure apparatus comprising:
   an illumination optical system which applies light including a wave band having absorbability with respect to oxygen to a mask formed with a pattern;
   a projection optical system which forms a pattern image of said illuminated mask onto a substrate;
   gas supply system which supplies an optical path extending over from said illumination optical system to said projection optical system with an inert gas having lower absorption characteristics than oxygen with respect to the wave band of said illuminating light; and
   a gas replacement mechanism attached to a substrate side end of said projection optical system for replacing gas existing in a space defined between the substrate side end of said projection optical system and said substrate by a substance having absorbability less than that of oxygen with respect to the wavelength area of said illumination light.

7. A projection exposure apparatus according to claim 6, wherein said gas replacement mechanism has a partition wall which shuts off said space from an atmosphere, and a transparent member which permits transmission of said illuminating light,
   said gas supply system supplying said inert gas into a hermetic space which is formed by said partition wall and said transparent member.

8. An exposure apparatus according to claim 7, wherein said transparent member is exchangeable.

9. A projection exposure apparatus according to claim 7, further comprising a focus detecting system in which measuring light is incident obliquely on a surface of said substrate through the hermetic space formed by said gas replacement mechanism, and reflected light from said substrate is received through said hermetic space, thereby optically detecting a heightwise position of said substrate,
   said gas replacement mechanism having a first light-transmitting portion which permits transmission of the measuring light entering it toward said substrate, and a second light-transmitting portion which permits transmission of said measuring light reflected from said substrate surface.

10. A projection exposure apparatus according to claim 7, wherein said transparent member can adjust image formation characteristics of said projection optical system by changing its configuration or material.

11. A projection exposure apparatus according to claim 7, wherein said gas supply system supplies the inert gas into said gas replacement mechanism and also adjusts a refractive index of said inert gas in said hermetically sealing device.

12. A projection exposure apparatus according to claim 6, wherein said gas replacement mechanism consists essentially of a transparent member which permits transmission of said illuminating light.

13. A projection exposure apparatus comprising:
    an illumination optical system which applies light of a specific wavelength to a mask formed with a pattern;
    a projection optical system which projects a pattern image of said illuminated mask onto a substrate;
    gas supply system which supplies an inert gas into an optical path extending over from said illumination optical system to said projection optical system;
    first hermetically sealing device which shuts off from an atmosphere an optical path extending from a light source of said illumination optical system to an end of said projection optical system which is closer to said mask;
    at least one partition device which partitions a space in said first hermetically sealing device to form a plurality of hermetic blocks which are to be filled with an inert gas, said at least one partition device being selectively movable between a first position where, when projection exposure is carried out, said partition device allows passage of exposure light and does not shut off said hermetic blocks from each other, and a second position where said partition device shuts off said hermetic blocks from each other when projection exposure is not carried out; and
    second hermetically sealing device disposed in a space between an end of said projection optical system which is closer to said substrate and a neighborhood of said substrate for replacing almost all atmosphere existing in a neighborhood of an optical path of said illuminating light in said space by a substance other than oxygen.

14. A projection exposure apparatus according to claim 13, wherein said partition device has a partition wall which is approximately perpendicular to said optical path and which has an opening that allows passage of exposure light and communication of the inert gas between a pair of adjacent hermetic blocks, and closing member which hermetically closes said opening by reciprocally moving relative to said partition wall as occasion demands.

15. A projection exposure apparatus according to claim 13, wherein said first hermetically sealing device has evacuation system which evacuates each of the hermetic blocks partitioned by said partition device.

16. A projection exposure apparatus according to claim 13, wherein said second hermetically sealing device has a partition wall which shuts off said space from an atmosphere, and a transparent member which permits transmission of said illuminating light,
    said gas supply system supplying said inert gas into a hermetic space which is formed by said partition wall and said transparent member.

17. A projection exposure apparatus according to claim 13, wherein said second hermetically sealing device consist essentially of a transparent member which permits transmission of said illuminating light.

18. An exposure method for projecting an image of patterns formed on a mask onto a substrate through a projection optical system by using an energy beam, said method comprising the steps of:
    disposing a transparent member which permits transmission of energy beam therethrough, between said projection optical system and said substrate; and placing a medium, having absorbability less than that of oxygen, within a space between said transparent member and said projection optical system.

19. An exposure method according to claim 18, wherein said medium is an inert gas and said transparent member is exchangeable.

20. An exposure method according to claim 19, wherein said medium is nitrogen or helium.

21. An exposure method according to claim 18, wherein said light sources radiates the energy beam having a wavelength less than 200 nm.

22. An exposure method according to claim 18, wherein said transparent member is shaped so as to have a predetermined refractive index.

23. An exposure method according to claim 18, wherein said transparent member is an optical member capable of correcting aberration of said projection optical system.

24. An exposure optical system in which a plurality of optical parts are housed in a frame, comprising:
   a plurality of chambers formed in said frame, and said optical parts forming a portion of at least one chamber of said plurality of chambers;
   a gas supply system connected to the chambers to supply gas in said chambers; and
   an atmosphere releasing mechanism arranged at a predetermined chamber among said plurality of chambers and releasing said predetermined chamber to atmosphere independently of the other chambers.

25. An exposure optical system according to claim 24, further comprising a connection passage through which said plurality of chambers are interconnected to each other,
   said gas supply system including a gas supply device connected to one end of said chambers to supply specific gas into said chambers, and gas discharging device connected to the other end of said chambers to discharge gas from said chambers;
   at least one chamber among said plurality of chambers being provided with a lid which opens and closes said chamber, and a valve connected to said connection passage to block communication through said connection passage between said one chamber and the adjacent chamber when said lid is opened and to permit such a communication when said lid is closed.

26. An exposure optical apparatus according to claim 25, further comprising:
   an oxygen density sensor which detects oxygen density in said chamber having said lid; and
   a discharge switching mechanism which permits gas discharge to the adjacent chamber through said connection passage on a side of said another chamber arranged at the other end when the oxygen density detected by said oxygen density sensor is less than a predetermined value and which discharges gas in said chamber having said lid out of said frame when the oxygen density is greater than the predetermined value.

27. An exposure apparatus using the exposure optical system according to claim 26, comprising:
   a flow rate sensor which detects a flow rate of gas discharged from said discharge passage; and
   a control device which effects control so that a light source of the exposure apparatus is turned OFF when the flow rate detected by said flow rate sensor is less than a predetermined value.

28. An exposure apparatus according to claim 27, wherein:
   a light source emitting exposure light to said optical system is connected to any one of said plurality of chambers; and further comprising:
   a partition member disposed between said light source and a chamber adjacent to said light source and permitting transmission of the exposure light from said light source.

29. An exposure optical system in which a plurality of optical parts are housed in a frame, wherein:
   a plurality of chambers are formed in said frame, and said optical parts are housed in the different chambers of said frame, respectively;
   gas supply system connected to said chambers to supply special gas into said chambers, respectively;
   a first discharge system connected to said chambers to discharge gas from said chambers;
   a lid provided to at least one chamber among said plurality of chambers to open and close said chamber;
   a second discharge system connected to said chambers to discharge gas from said chambers;
   a valve provided between said gas supply system and said chamber to block supply of special gas from said gas supply system when said lid is opened and which permits supply of special gas from said gas supply system when said lid is closed;
   an oxygen density sensor disposed in said chamber and detecting oxygen density in said chamber; and
   a switching mechanism disposed at said first discharge system and said second discharge system to permit gas discharge from said first discharge system when the oxygen density detected by said oxygen density sensor is less than a predetermined value and which discharges the gas through said second discharge system when the oxygen density is greater than the predetermined value.

30. An exposure apparatus comprising:
   a light source emitting exposure light;
   an optical system disposed at a position on which said exposure light is incident;
   a frame arranged around said optical system and containing said optical system;
   a light source unit connected to said frame and containing said light source; and
   a light transmitting member provided between said frame and said light source unit and adapted to isolate a space within said frame from another space within said light source unit and permitting transmission of the exposure light of said light source.

31. An exposure apparatus according to claim 30, wherein said light transmitting member forms a part of a transmission optical system which directs the exposure light from said light source to said optical system, and said light transmitting member is arranged so as to be inclined with respect to an optical axis of a transmission optical system.

32. An exposure apparatus for projecting an image of patterns formed on a mask onto a substrate by using an illumination light from a light source, comprising:
   a frame disposed around an optical path of said illumination light and isolating said optical path from atmosphere; and
   a space dividing mechanism arranged within said frame and adapted to divide a space within said frame into a first space and a second space and releasing said second space to atmosphere without releasing said first space to atmosphere.

33. An exposure apparatus according to claim 32, wherein said space dividing mechanism comprises:
   at least one partition member arranged within said frame and adapted to form said first space and said second space within said frame; and a switching mechanism connected to said partition member and adapted to switch said partition member between a first position where said first space and said second space are communicated with each other, and a second position where said first space and said second space are separated from each other.

34. An exposure apparatus according to claim 32, wherein said frame comprises:

a measurement device disposed within said optical path and measuring an amount of energy of said illumination light; and a light shielding mechanism connected to said measurement device and shielding said illumination light radiated from said light source on the basis of the result of the measurement of said measurement device.

35. An exposure apparatus according to claim 34, wherein a plurality of partition members are arranged within said frame and adapted to form said first space and said second space within said frame, and said light shielding mechanism corresponds to a partition member among said partition members, which is closest to said light source.

36. An exposure apparatus for projecting an image of patterns formed on a mask onto a substrate through a projection optical system by using an illumination light from a light source, comprising:

an optical member disposed between said projection optical system and said substrate for permitting transmission of said illumination light, said optical member being arranged at a substrate side end of said projection optical system and isolating a space formed between said projection optical system and said substrate from an outer space outside said isolated space; and a gas supply mechanism connected to said isolation member and supplying inert gas into said isolated space formed between said projection optical system and said substrate.

37. An exposure apparatus according to claim 36, wherein said optical member is attached to said projection optical system through an isolation wall provided on a substrate side end of said projection optical system, and wherein said gas supply mechanism supplies said inert gas into a space formed between said isolation wall and said optical member.

38. An exposure apparatus according to claim 37, further comprises a focus point detecting mechanism, which is arranged so as to be inclined with respect to a surface of said substrate and which emits a measurement light toward said surface of the substrate in a direction, inclined with respect to said surface of the substrate, through said isolated space isolated by said isolation member and receives said measurement light reflected from said surface of the substrate through said isolated space to thereby optically detect a height position of said substrate; and wherein said isolation member has a first transparent member which permits transmission of said measurement light incident on said substrate and a second transparent member which permits transmission of said measurement light reflected from said surface of said substrate.

39. An exposure apparatus according to claim 38, wherein material of said transparent members can be changed such that the focusing property of said projection optical system can be adjusted.

40. An exposure apparatus according to claim 38, wherein said gas supply mechanism supplies said inert gas into said isolation member and adjusts a refractive index of the inert gas within said isolation member.

41. An exposure method for projecting an image of patterns formed on a mask onto a substrate by using an illumination light from a light source, comprising the steps of:

isolating an optical path of said illumination light from atmosphere by a frame disposed around said optical path of the illumination light;

dividing a space within said frame into a first space and a second space, said first space being formed among a plurality of optical elements which illuminate said illumination light onto said mask: and releasing said second space to atmosphere without releasing said first space to atmosphere.

42. An exposure method according to claim 41, wherein said step of releasing said second space to atmosphere is performed by opening a lid which forms a portion of said second space.

43. An exposure method according to claim 41, wherein an amount of energy of said illumination light is measured by a measurement device arranged within said light path, and wherein said illumination light from said illumination source is shut off based on a measurement result of said measurement device.

* * * * *

UNITED STATES PATENT AND TRADEMARK OFFICE
CERTIFICATE OF CORRECTION

PATENT NO. : 6,341,006 B1 Page 1 of 1
DATED : January 22, 2002
INVENTOR(S) : Murayama et al.

It is certified that error appears in the above-identified patent and that said Letters Patent is hereby corrected as shown below:

<u>Title page,</u>
Item [63], Related U.S. Application Data,
Change "Continuation of application No. 09/207,270, filed on Dec. 8, 1998, which is a continuation-in-part of application No. 08/972,434, filed on Nov. 18, 1997, which is a continuation of application No. 08/628,452 filed on Apr. 5, 1996, now abandoned." to read -- Continuation of application No. 09/207,270, filed on Dec. 8, 1998, now abandoned, which is a continuation-in-part of application No. 08/972,434, filed on Nov. 18, 1997, now abandoned, which is a continuation of application No. 08/628,452 filed on Apr. 5, 1996, now abandoned. --

Item [30], Foreign Application Priority Data, insert
-- Nov. 27, 1998 (JP) ................... 10-337591 --

Signed and Sealed this

Thirtieth Day of July, 2002

*Attest:*

*Attesting Officer*

JAMES E. ROGAN
*Director of the United States Patent and Trademark Office*